United States Patent
Harada

(10) Patent No.: US 7,157,780 B2
(45) Date of Patent: Jan. 2, 2007

(54) SEMICONDUCTOR DEVICE AND METHOD FOR PRODUCING THE SAME

(75) Inventor: Yoshinao Harada, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 134 days.

(21) Appl. No.: 10/602,724

(22) Filed: Jun. 25, 2003

(65) Prior Publication Data

US 2004/0084736 A1 May 6, 2004

Related U.S. Application Data

(62) Division of application No. 10/122,366, filed on Apr. 16, 2002, now Pat. No. 6,642,131.

(60) Provisional application No. 60/299,478, filed on Jun. 21, 2001.

(30) Foreign Application Priority Data

Dec. 27, 2001 (JP) ............................. 2001-395734

(51) Int. Cl.
*H01L 21/8238* (2006.01)
*H01L 29/96* (2006.01)

(52) U.S. Cl. .................. 257/410; 257/411; 257/412; 257/413; 257/310; 257/200; 257/52

(58) Field of Classification Search ................ 257/408, 257/409, 410, 411, 310, 311; 488/591, 216, 488/287, 787
See application file for complete search history.

(56) References Cited

U.S. PATENT DOCUMENTS

| 6,013,553 | A | 1/2000 | Wallace et al. |
| 6,060,755 | A * | 5/2000 | Ma et al. .................... 257/410 |
| 6,184,072 | B1 * | 2/2001 | Kaushik et al. .............. 438/197 |
| 6,291,867 | B1 * | 9/2001 | Wallace et al. .............. 257/410 |
| 6,313,539 | B1 * | 11/2001 | Yokoyama et al. ......... 257/761 |
| 6,521,911 | B1 | 2/2003 | Parsons et al. |
| 6,642,131 | B1 * | 11/2003 | Harada ....................... 438/591 |
| 6,740,928 | B1 * | 5/2004 | Yoshii et al. ................ 257/315 |
| 2002/0001906 | A1 * | 1/2002 | Park ........................... 438/287 |
| 2002/0043666 | A1 | 4/2002 | Parsons et al. |

FOREIGN PATENT DOCUMENTS

| EP | 0077200 A2 | 4/1980 |
| EP | 0143700 A2 | 6/1985 |
| EP | 1 108 805 A1 | 6/2001 |
| JP | 2000-208508 A | 7/2000 |
| JP | 2001-148380 A | 5/2001 |
| WO | WO 02/09167 A3 | 1/2002 |

OTHER PUBLICATIONS

Chambers and Parsons, "Yttrium silicate formation on silicon: Effect of silicon preoxidation and nitridation on interface reaction kinetics" Applied Physics Letters 77(15), Oct. 9, 2000, pp. 2385-2387.

(Continued)

*Primary Examiner*—Leonardo Andujar
*Assistant Examiner*—Fazli Erdem
(74) *Attorney, Agent, or Firm*—McDermott Will & Emery LLP

(57) ABSTRACT

A gate electrode is formed on a substrate via a gate insulating film. The gate insulating film includes a high dielectric constant film containing a metal, oxygen and hydrogen, and a lower barrier film formed below the high dielectric constant film and containing a metal, oxygen, silicon and nitrogen.

32 Claims, 14 Drawing Sheets

OTHER PUBLICATIONS

Gurvitch et al., "Study of thermally oxidized yttrium films on silicon" Applied Physics Letter 51(12), Sep. 21, 1987, pp. 919-921.

Kalkur et al., "Yttrium oxide based metal-insulator-semiconductor structures on silicon" Thin Solid Films 170, 1989, pp. 185-189.

Pierson, Hugh, O., Handbook of Chemical Vapor Deposition, Noyes Publications, Park Ridge, New Jersey pp. 229-230.

* cited by examiner

Figure 3

| A | B |
|---|---|
| 750 | $\geq 0.1$ |
| 800 | $\geq 7.6$ |
| 850 | $\geq 15.0$ |
| 900 | $\geq 23.0$ |
| 950 | $\geq 30.0$ |
| 1000 | $\geq 37.5$ |
| 1050 | $\geq 45.0$ |
| 1100 | $\geq 52.4$ |

A: Maximum process temperature

B: Practical range of
(Si concentration /(Si concentration + Hf concentration)) × 100[%],
in which the thermal stability of Hf silicate can be ensured.

Figure 6
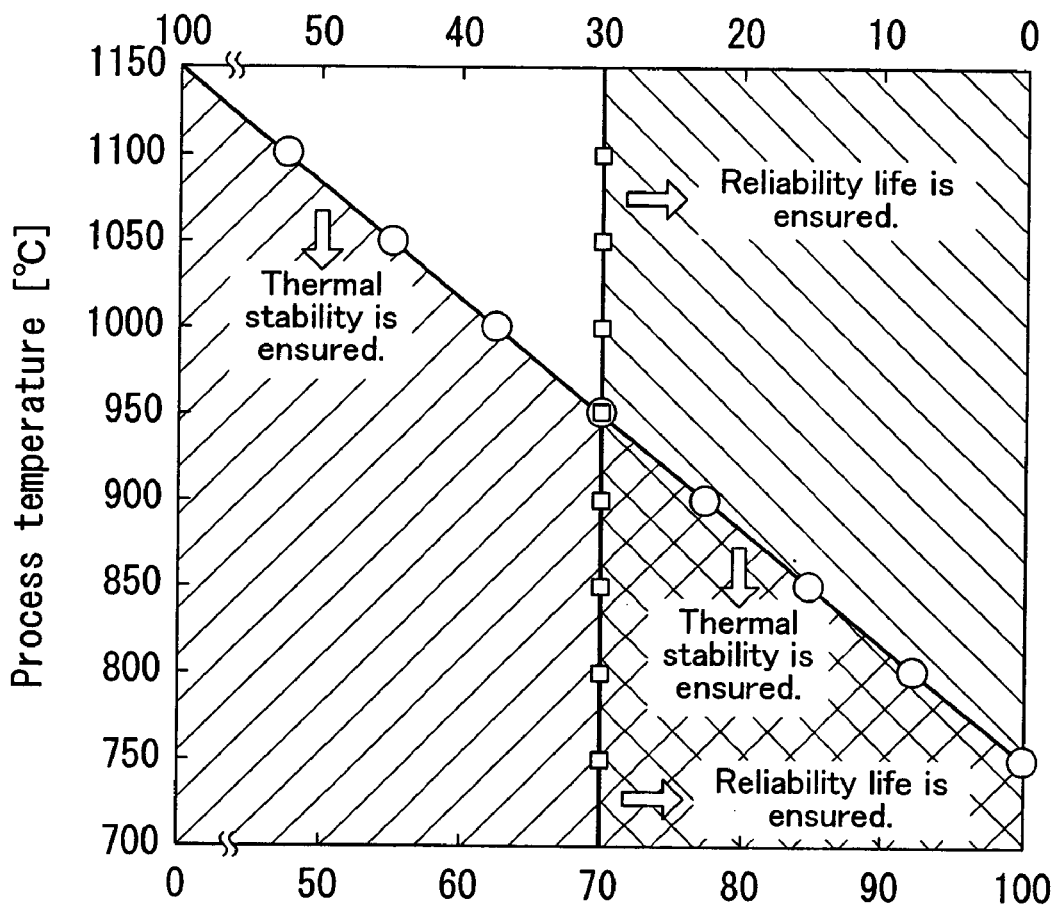
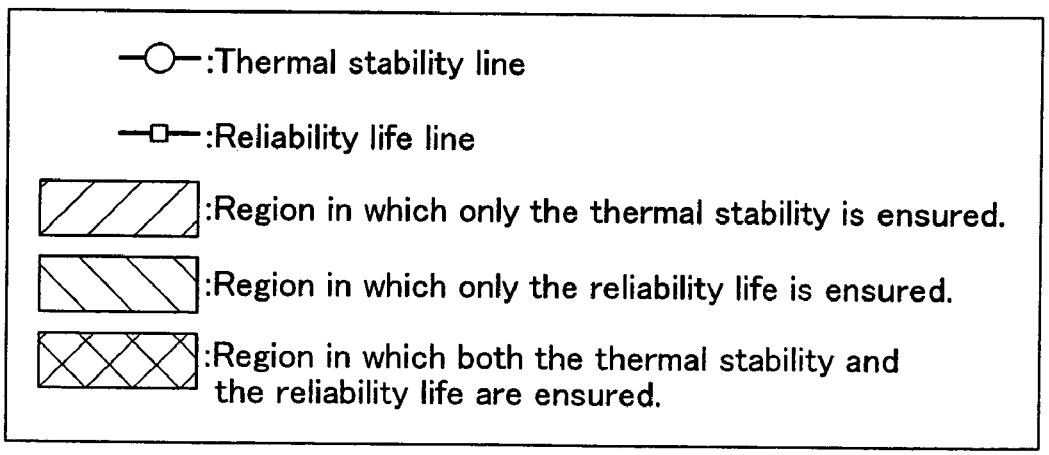

Figure 9A  [before PDA]
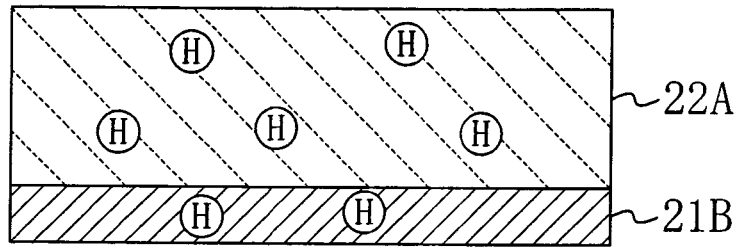
Figure 9B  [700°C PDA→hydrogen desorption]
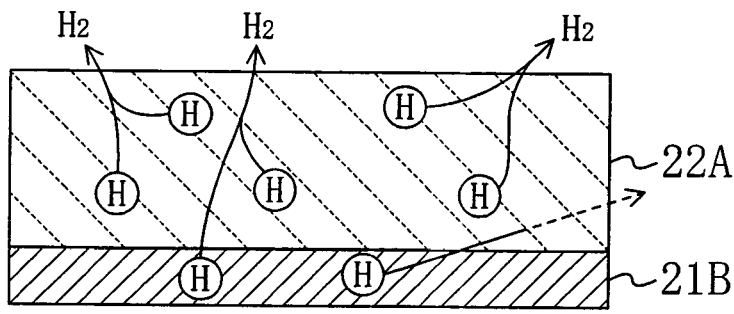
Figure 9C  [vacancy formation]
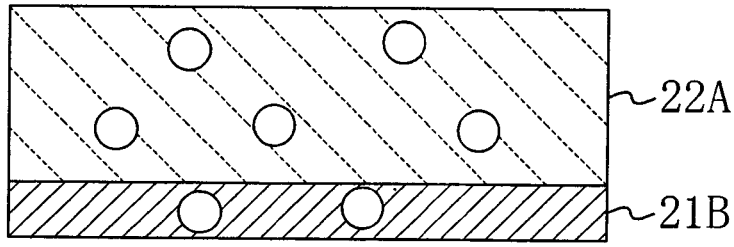
Figure 9D  [Hf diffusion + Si diffusion]
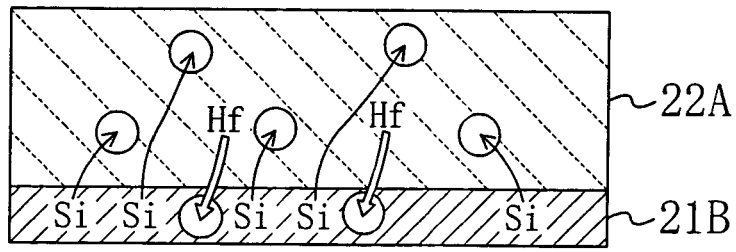

SEMICONDUCTOR DEVICE AND METHOD FOR PRODUCING THE SAME

RELATED APPLICATIONS

This application is a divisional of application Ser. No. 10/122,366 filed Apr. 16, 2002 now U.S. Pat. No. 6,642,131.

This application claims priority from U.S. Provisional Application No. 60/299,478, filed on Jun. 21, 2001, and Japanese Patent Application No. 2001-395734, filed Dec. 27, 2001.

BACKGROUND OF THE INVENTION

The present invention relates to a semiconductor device and a method for producing the same, in particular, a high dielectric constant film used for a gate insulating film.

With recent technological advance with respect to high integration and high speed in semiconductor devices, miniaturization of MOSFETs has been under development. When the thickness of a gate insulating film is being reduced to achieve the miniaturization, problems such as an increase of a gate leak current due to tunneling current are caused. In order to suppress this problem, there has been research on an approach to increase a physical thickness while realizing a small $SiO_2$ equivalent thickness (hereinafter, referred to as "EOT") by using gate insulating films made of high dielectric constant material such as hafnium oxide ($HfO_2$) and zirconium oxide ($ZrO_2$) (hereinafter, referred to as "high-k gate insulating films").

For example, a method for forming a conventional high-k gate insulating film described in U.S. Pat. No. 6,013,553 is as follows. First, an oxide layer such as a $SiO_2$ layer is formed on a silicon substrate, and then a metal film made of zirconium or hafnium is deposited on the oxide layer by sputtering or plasma CVD. Thereafter, the metal film is subjected to an oxynitridation treatment with gas such as NO to form a high-k gate insulating film made of zirconium oxynitride ($ZrO_xN_y$) or hafnium oxynitride ($HfO_xN_y$).

However, in the conventional high-k gate insulating film, when heat history is applied by a high temperature treatment during the production process, the high dielectric constant material constituting the gate insulating film is crystallized, so that the electrical conductivity via the resultant crystal grain boundaries or the defect level increases leak current. That is to say, the thermal stability of the conventional high-k gate insulating film is insufficient.

SUMMARY OF THE INVENTION

Therefore, with the foregoing in mind, it is an object of the present invention to provide a semiconductor device employing a thermally stable gate insulating film having a high relative dielectric constant.

In order to achieve the object, a semiconductor device of the present invention includes a gate insulating film formed on a substrate; and a gate electrode formed on the gate insulating film, and the gate insulating film includes a high dielectric constant film containing a metal, oxygen and silicon; and a lower barrier film formed below the high dielectric constant film and containing the metal, oxygen, silicon and nitrogen.

According to the semiconductor of the present invention, the high dielectric constant film constituting the gate insulating film contains silicon, so that the high dielectric constant film is prevented from being crystallized by a high temperature treatment in the production process (e.g., a heat treatment for activating impurities at about 900° C.). Therefore, in a finished semiconductor device, the high dielectric constant film remains mostly amorphous, so that leak current can be suppressed from occurring in the high-k gate insulating film. Consequently, the thermal stability of the high-k gate insulating film can be improved, and therefore a semiconductor device having excellent heat resistance can be realized, and the process margin in the production of a semiconductor device can be increased.

According to the semiconductor of the present invention, the lower barrier film is present below the high dielectric constant film in the gate insulating film, so that the high dielectric constant film can be prevented from reacting with the substrate. Moreover, the lower barrier film contains the same metal as in the high dielectric constant film, so that the relative dielectric constant of the lower barrier film can be increased, and thus the relative dielectric constant of the entire gate insulting film can be increased.

In the semiconductor device of the present invention, it is preferable that the gate insulating film includes an upper barrier film formed above the high dielectric constant film, and the upper barrier film contains the metal, oxygen and nitrogen.

This prevents the gate electrode material and the high dielectric constant film material from being diffused to each other. Moreover, the upper barrier film contains the same metal as in the high dielectric constant film, so that the relative dielectric constant of the upper barrier film can be increased, and thus the relative dielectric constant of the gate insulting film as a whole can be increased.

In the semiconductor device of the present invention, it is preferable to satisfy $$0.23 \leq y/(x+y) \leq 0.90$$

when the composition of the high dielectric constant film is expressed as $M_xSi_yO$, where M, O and Si represent the metal, oxygen and silicon, respectively, and X>0 and y>0.

This ensures the thermal stability of the high-k gate insulating film against a heat treatment at about 900° C. while keeping the relative dielectric constant of the high-k gate insulting film sufficient.

In the semiconductor device of the present invention, it is preferable to satisfy $$0.23 \leq y/(x+y) \leq 0.30$$

when the composition of the high dielectric constant film is expressed as $M_xSi_yO$, where M, O and Si represent the metal, oxygen and silicon, respectively, and X>0 and y>0.

This ensures the thermal stability of the high-k gate insulating film against a heat treatment at about 900° C. while keeping the reliability life of the high-k gate insulting film sufficient.

In the semiconductor device of the present invention, it is preferable to satisfy $$x/(x+y) \geq 0.10$$

when the metal is hafnium or zirconium, and the composition of the lower barrier film is expressed as $M_xSi_yON$, where M, O, Si and N represent the metal, oxygen, silicon and nitrogen, respectively, and x>0 and y>0.

This ensures that the relative dielectric constant of the lower barrier film can be increased.

In the semiconductor device of the present invention, the gate electrode may be a metal gate electrode.

A first method for producing a semiconductor device of the present invention includes the steps of forming a high dielectric constant film containing a metal, oxygen and a predetermine substance on a substrate; performing a heat treatment with respect to the high dielectric constant film to diffuse silicon from the side of the substrate into the high dielectric constant film, thereby forming a silicon-containing high dielectric constant film; and forming a conductive film for serving as a gate electrode on the silicon-containing high dielectric constant film.

According to the first method for producing a semiconductor device, a predetermined substance can be desorbed from the high dielectric constant film by performing a heat treatment with respect to the high dielectric constant film containing the predetermined substance, so that silicon is diffused in the high dielectric constant film through the thus formed vacancies and thus a silicon-containing high dielectric constant film can be formed. Therefore, silicon can be contained in the high dielectric constant film efficiently, and the vacancies eventually disappear, so that the silicon-containing high dielectric constant film can become dense. The silicon-containing high dielectric constant film hardly is crystallized by a high temperature treatment in the production process, so that the silicon-containing high dielectric constant film remains mostly amorphous after a device is complete. As a result, leak current can be suppressed from occurring in the gate insulating film including the silicon-containing high dielectric constant film, that is, the high-k gate insulating film. Consequently, the thermal stability of the high-k gate insulating film can be improved, and therefore a semiconductor device having excellent heat resistance can be realized, and the process margin in the production of a semiconductor device can be increased.

In the first semiconductor method of the present invention, it is preferable the predetermined substance is hydrogen.

This ensures that silicon can be diffused in the high dielectric constant film.

It is preferable that the first semiconductor method includes forming an insulating film containing silicon, nitrogen and the predetermined substance on the substrate before the step of forming the high dielectric constant film; and that the step of performing a heat treatment with respect to the high dielectric constant film comprises diffusing silicon contained in the insulating film into the high dielectric constant film, and forming a lower barrier film by diffusing the metal contained in the high dielectric constant film into the insulating film.

This ensures that silicon can be diffused in the high dielectric constant film. Furthermore, the high dielectric constant film or the silicon-containing high dielectric constant film can be prevented from reacting with the substrate. Moreover, the lower barrier film contains the same metal as in the silicon-containing high dielectric constant film, so that the relative dielectric constant of the lower barrier film can be increased, and thus the relative dielectric constant of the gate insulting film as a whole can be increased.

In the first method for producing a semiconductor device, it is preferable that the step of forming a high dielectric constant film comprises forming a high dielectric constant film by CVD employing a source precursor containing the metal and the predetermined substance.

Thus ensures that a high dielectric constant film containing the predetermined substance is formed.

In the first method for producing a semiconductor device, it is preferable that the step of forming the high dielectric constant film includes forming the high dielectric constant film by CVD employing a source precursor containing the metal and a source gas containing the predetermined substance.

Thus ensures that a high dielectric constant film containing the predetermined substance is formed.

In the first method for producing a semiconductor device, it is preferable that the step of forming the high dielectric constant film includes forming the high dielectric constant film by PVD employing a target containing the metal in an atmosphere containing the predetermined substance.

Thus ensures that a high dielectric constant film containing the predetermined substance is formed.

A second method for producing a semiconductor device of the present invention includes the steps of forming a high dielectric constant film containing a metal, oxygen and hydrogen on a substrate; performing a heat treatment with respect to the high dielectric constant film to diffuse silicon from the side of the substrate into the high dielectric constant film, thereby forming a silicon-containing high dielectric constant film; and forming a conductive film for serving as a gate electrode on the silicon-containing high dielectric constant film.

According to the second method for producing a semiconductor device, hydrogen can be desorbed from the high dielectric constant film by performing a heat treatment with respect to the high dielectric constant film containing hydrogen, so that silicon is diffused in the high dielectric constant film through the thus formed vacancies and thus a silicon-containing high dielectric constant film can be formed. Therefore, silicon can be contained in the high dielectric constant film efficiently, and the vacancies eventually disappear, so that the silicon-containing high dielectric constant film can become dense. The silicon-containing high dielectric constant film hardly is crystallized by a high temperature treatment in the production process, so that the silicon-containing high dielectric constant film remains mostly amorphous after a device is complete. As a result, leak current can be suppressed from occurring in the gate insulating film including the silicon-containing high dielectric constant film, that is, the high-k gate insulating film. Consequently, the thermal stability of the high-k gate insulating film can be improved, and therefore a semiconductor device having excellent heat resistance can be realized, and the process margin in the production of a semiconductor device can be increased.

It is preferable that the second method for producing a semiconductor device includes forming an insulating film containing silicon, nitrogen and hydrogen on the substrate before the step of forming the high dielectric constant film; and that the step of performing a heat treatment with respect to the high dielectric constant film includes diffusing silicon contained in the insulating film into the high dielectric constant film, and forming a lower barrier film by diffusing the metal contained in the high dielectric constant film into the insulating film.

This ensures that silicon can be diffused in the high dielectric constant film. Furthermore, the high dielectric constant film or the silicon-containing high dielectric constant film can be prevented from reacting with the substrate. Moreover, the lower barrier film contains the same metal as in the silicon-containing high dielectric constant film, so that the relative dielectric constant of the lower barrier film can be increased, and thus the relative dielectric constant of the entire gate insulting film can be increased.

In the second method for producing a semiconductor device, it is preferable that the step of forming the high dielectric constant film includes forming the high dielectric constant film by CVD employing a source precursor containing the metal and hydrogen.

Thus ensures that a high dielectric constant film containing hydrogen can be formed.

In the second method for producing a semiconductor device, it is preferable that the step of forming the high dielectric constant film includes forming the high dielectric constant film by CVD employing a source precursor containing the metal and a source gas containing hydrogen.

Thus ensures that a high dielectric constant film containing hydrogen can be formed.

In the second method for producing a semiconductor device, it is preferable that the step of forming the high dielectric constant film includes forming the high dielectric constant film by PVD employing a target containing the metal in an atmosphere containing hydrogen.

Thus ensures that a high dielectric constant film containing hydrogen can be formed.

In the first or the method for producing a semiconductor device, it is preferable that the metal is hafnium or zirconium.

This ensures that the relative dielectric constant of the silicon-containing high dielectric constant film can be increased.

In the first or the second method for producing a semiconductor device, it is preferable that the method includes the step of forming an upper barrier by nitriding a surface of the silicon-containing high dielectric constant film between the step of performing a heat treatment with respect to the high dielectric constant film and the step of forming a conductive film.

This prevents the gate electrode material and the high dielectric constant film material from being diffused to each other. Moreover, the upper barrier film contains the same metal as in the high dielectric constant film, so that the relative dielectric constant of the upper barrier film can be increased, and thus the relative dielectric constant of the entire gate insulting film can be increased.

In the first or the second method for producing a semiconductor device, it is preferable that the method includes the step of forming an upper barrier by nitriding a surface of the high dielectric constant film between the step of forming a high dielectric constant film and the step of performing a heat treatment with respect to the high dielectric constant film.

This prevents the gate electrode material and the high dielectric constant film material from being diffused to each other. Moreover, the upper barrier film contains the same metal as in the high dielectric constant film, so that the relative dielectric constant of the upper barrier film can be increased, and thus the relative dielectric constant of the entire gate insulting film can be increased.

In the first or the second method for producing a semiconductor device, it is preferable that the temperature for the heat treatment in the step of performing the heat treatment with respect to the high dielectric constant film is 600° C. or more and 850° C. or less.

This ensures that the predetermined substance or hydrogen can be desorbed from the high dielectric constant film, and that silicon can be diffused in the high dielectric constant film.

In the first or the second method for producing a semiconductor device, it is preferable to satisfy $T \leq 6.69 \cdot y/(x+y)+749.4$, when the composition of the silicon-containing high dielectric constant film is expressed as $M_xSi_yO$, where M, O and Si represent the metal, oxygen and silicon, respectively, and $x>0$ and $y>0$, and the maximum temperature in the production process is expressed as $T$ [° C.].

This ensures the thermal stability of the high-k gate insulating film having the silicon-containing high dielectric constant film.

In this case, it is preferable that the gate electrode is made of a material containing silicon, and $y/(x+y) \leq 0.30$ is satisfied.

This enables a sufficient reliability life for the high-k gate insulating film having the silicon-containing high dielectric constant film.

In the first or the second method for producing a semiconductor device, it is preferable that the gate electrode is a metal gate electrode, and the method includes the step of performing a heat treatment with respect to the substrate after the step of forming a conductive film.

This allows the defects in the high-k gate insulating film having the silicon-containing high dielectric constant film to be reduced further.

BRIEF DESCRIPTION OF THE DRAWINGS

FIG. 3 is a diagram showing the allowable range of the composition of Hf silicate that can maintain the thermal stability obtained corresponding to various maximum process temperatures.

FIG. 6 is a graph showing the relationship between the amount of Si added to a $HfO_2$ film and the thermal stability and the reliability of the $HfO_2$ film.

FIGS. 9A to 9D are views illustrating the behavior resulted from PDA in the method for producing the semiconductor device according to the second embodiment of the present invention.

DETAILED DESCRIPTION OF THE INVENTION

First Embodiment

Hereinafter, a semiconductor device of a first embodiment of the present invention, more specifically, a MISFET will be described with reference to the accompanying drawings.

Figure 1:
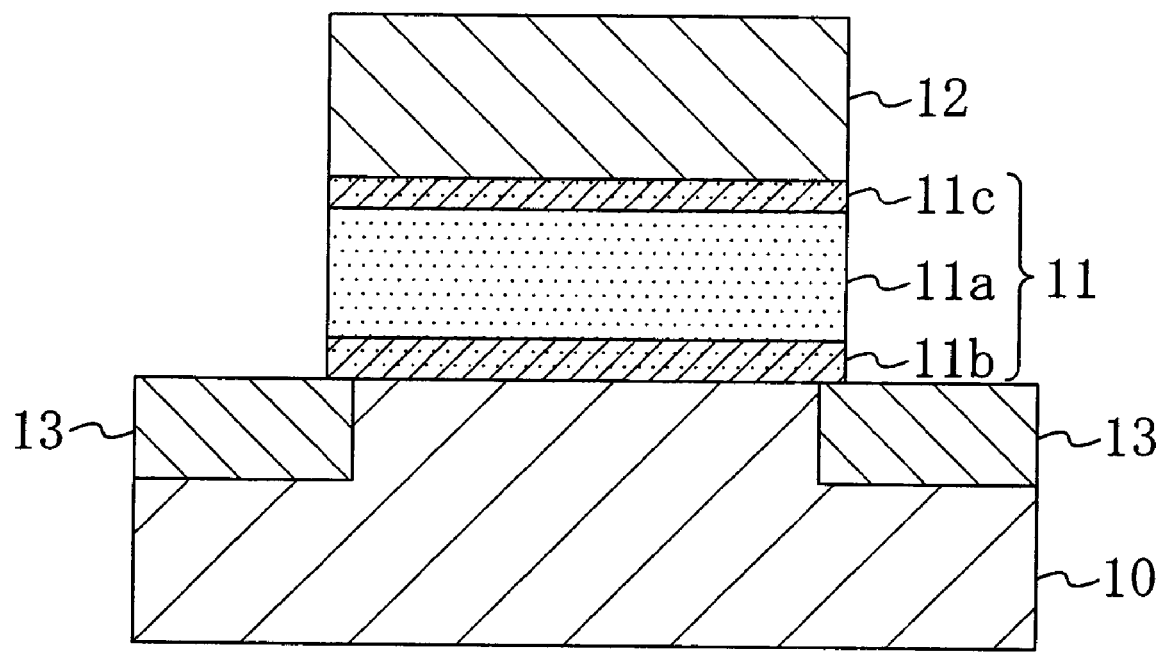
FIG. 1 is a cross-sectional view of a semiconductor device according to a first embodiment of the present invention.

FIG. 1 shows the cross-sectional structure of a semiconductor device of a first embodiment.

As shown in FIG. 1, a gate electrode 12 is formed on a silicon substrate 10 via a gate insulating film 11. An impurity diffusion layer 13 serving as a source region or a drain region is formed on both sides of the gate electrode 12 in the silicon substrate 10. The gate insulating film 11 includes a high dielectric constant film 11a made of insulative metal oxide, a lower barrier film 11b formed below the high dielectric constant film 11a, and an upper barrier film 11c formed above the high dielectric constant film 11a.

More specifically, the high dielectric constant film 11a is formed of a substance in which silicon is contained in hafnium oxide (HfO$_2$) having a high relative dielectric constant, that is, a silicon-containing hafnium oxide (Hf$_x$Si$_y$O$_2$, where x>y>0). The lower barrier film 11b for preventing a reaction between the silicon substrate 10 and the high dielectric constant film 11a is made of, for example, a silicon oxynitride film containing hafnium. The upper barrier film 11c for preventing a reaction between the high dielectric constant film 11a and the gate electrode 12 is made of, for example, a silicon-containing hafnium oxide film containing nitrogen. That is to say, the lower barrier film 11b and the upper barrier film 11c are high dielectric constant barrier films. The gate electrode 12 is made of, for example, a polysilicon film doped with phosphorus.

The high dielectric constant film 11a may contain nitrogen. When the physical thickness of the gate insulating film 11 is about 4 nm, the physical thickness of the high dielectric constant film 11a is about 2 nm, the physical thickness of the lower barrier film 11b is slightly smaller than 1 nm, and the physical thickness of the upper barrier film 11c is slightly larger than 1 nm. All of the high dielectric constant film 11a, the lower barrier film 11b, and the upper barrier film 11c are amorphous.

In this embodiment, silicon is contained in the HfO$_2$ film that serves as the high dielectric constant film 11a for the purpose of ensuring the thermal stability of the high dielectric constant film 11a. In other words, the high dielectric constant film 11a containing silicon is hardly crystallized (or is only partially crystallized and remains amorphous) when being subjected to a heat treatment at a high temperature, so that an increase of leak current due to crystal grain boundaries or defect level can be suppressed. Hereinafter, this embodiment will be described more specifically with reference to the accompanying drawings.

Figure 2:
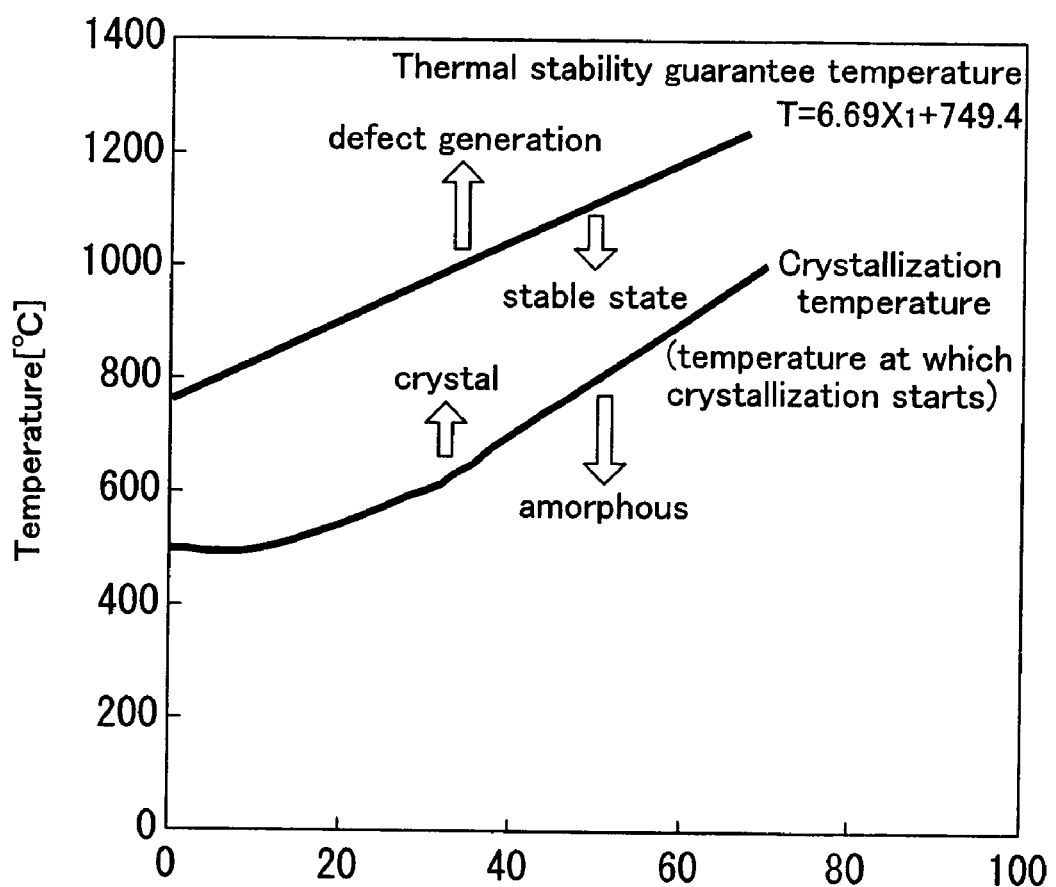
FIG. 2 is a graph showing the relationship between the amount of Si added to $HfO_2$ and the crystallization temperature of $HfO_2$ and the temperature that guarantees thermal stability of $HfO_2$.

FIG. 2 shows the relationship between the amount of silicon (Si) added to HfO$_2$ and the crystallization temperature of HfO$_2$ and the thermal stability guarantee temperature of HfO$_2$. The crystallization temperature refers to the temperature at which an amorphous state started to change into a crystalline state. In other words, since a change of the state starts at the crystallization temperature, the entire substance (HfO$_2$) is not necessarily crystallized immediately even if the temperature exceeds the crystallization temperature.

In FIG. 2, the horizontal axis shows the ratio X$_1$ (% representation) of the number of Si atoms contained in HfO$_2$ per unit volume (hereinafter, referred to as "Si concentration") to the sum of the Si concentration and the number of Hf atoms contained in HfO$_2$ per unit volume (hereinafter, referred to as "Hf concentration"). In other words, the far left end in the horizontal axis (X$_1$=(Si concentration/(Si concentration+Hf concentration))×100=0%) indicates HfO$_2$ that contains no Si, and the far right end in the horizontal axis (X$_1$=(Si concentration/(Si concentration+Hf concentration))×100=100%) indicates SiO$_2$ that contains no Hf. The vertical axis shows the temperature.

As shown in FIG. 2, the crystallization temperature and the thermal stability guarantee temperature of HfO$_2$ increase with the ratio X$_1$, that is, the amount of added Si. In other words, the addition of silicon to HfO2 increases the thermal stability of HfO$_2$. This is because an increase of the Si amount makes it easy that Si-containing HfO$_2$, that is, a Hf silicate material remains amorphous, and as a result, the entire HfO$_2$ film hardly is crystallized and remains amorphous.

Herein, the thermal stability guarantee temperature refers to the annealing temperature at which a drastic increase of leak current starts to occur in an insulating film made of HfO$_2$ when an annealing treatment is performed with respect to a MOS capacitor structure having the insulating film for 30 seconds in N$_2$ gas at 1 atm with a rapid thermal process (TP) apparatus. Therefore, at temperatures below the thermal stability guarantee temperature, the leak current and the capacitance in the MOS capacitor structure employing the Si-containing HfO$_2$ film indicates an ideal value. On the other hand, at temperatures above the thermal stability guarantee temperature, the leak current in the MOS capacitor structure increases by about three orders due to a drastic increase of defects locally occurring in the Si-containing HfO$_2$ film. At this point, the capacitance in an accumulation state in a C-V (capacitance-voltage) measurement diverges, and therefore it becomes impossible to measure the capacitance of the MOS capacitor. In other words, at temperatures above the thermal stability guarantee temperature, the MOS capacitor structure employing the Si-containing HfO$_2$ film cannot serve as a capacitor.

When the ratio X$_1$ is 70% or more, the substantially entire Si-containing HfO$_2$ film can be kept amorphous even at high temperatures, so that even if the film is subjected to a high temperature process at 1200° C., leak current can be suppressed. If the ratio X$_1$ is at least 23%, the crystals produced when the Si-containing HfO$_2$ film is crystallized are microcrystalline, and the film as a whole is predominantly in the amorphous state. Therefore, leak current can be suppressed even if the film is subjected to a high temperature process of 900° C. Herein, the case where the material to be used is mostly amorphous, or the case where the material to be used contains crystallites to the extent that makes substantially no influence on the thermal stability, that is, the heat resistance, is also regarded as being amorphous.

As shown in FIG. 2, the straight line showing the range of the process temperature that can be used in the process for producing a semiconductor device and the range of the Si concentration in the Si-containing HfO$_2$ film can be defined as $T=6.69 X_1+749.4$, where $X_1$ represents the Si concentration/(Si concentration+Hf concentration)×100 and T [° C.] represents the thermal stability guarantee temperature (more specifically, when a polysilicon electrode is used). In other words, it is necessary that the process temperature and the Si concentration are in the range below $T=6.69 \cdot X_1+749.4$. More specifically, when the value of $X_1$, that is, the composition of the Si-containing $HfO_2$ is determined, the process temperature has to be in the temperature range of not more than the thermal stability guarantee temperature T corresponding to the predetermined value of $X_1$. On the other hand, when the maximum temperature of the process is determined, it is necessary to select a Si-containing $HfO_2$ film, that is, a Hf silicate film to which Si is added such that $X_1$ is larger than a value of $X_1$ when the maximum temperature is used as the thermal stability guarantee temperature T. In the case of the structure of the semiconductor device of this embodiment shown in FIG. 1, the Si concentration can be determined as described above, with respect to, for example, either the entire gate insulating film 11 or a region about 2 nm below the interface with the gate electrode 12 in the gate insulating film 11 in view of a contact with the gate electrode 12.

FIG. 3 shows the allowable range of the composition ($X_1$) of Hf silicate that can ensure the thermal stability, which was obtained corresponding to various maximum process temperatures based on the relationship (experiment results) shown in FIG. 2. As shown in FIG. 3, for example, when the maximum process temperature is about 900° C. (e.g., in the process in which polysilicon is used as the electrode material), $X_1$ should be at least 23% in order to prevent a drastic increase of leak current due to defects or the like and ensures the thermal stability.

Figure 4:
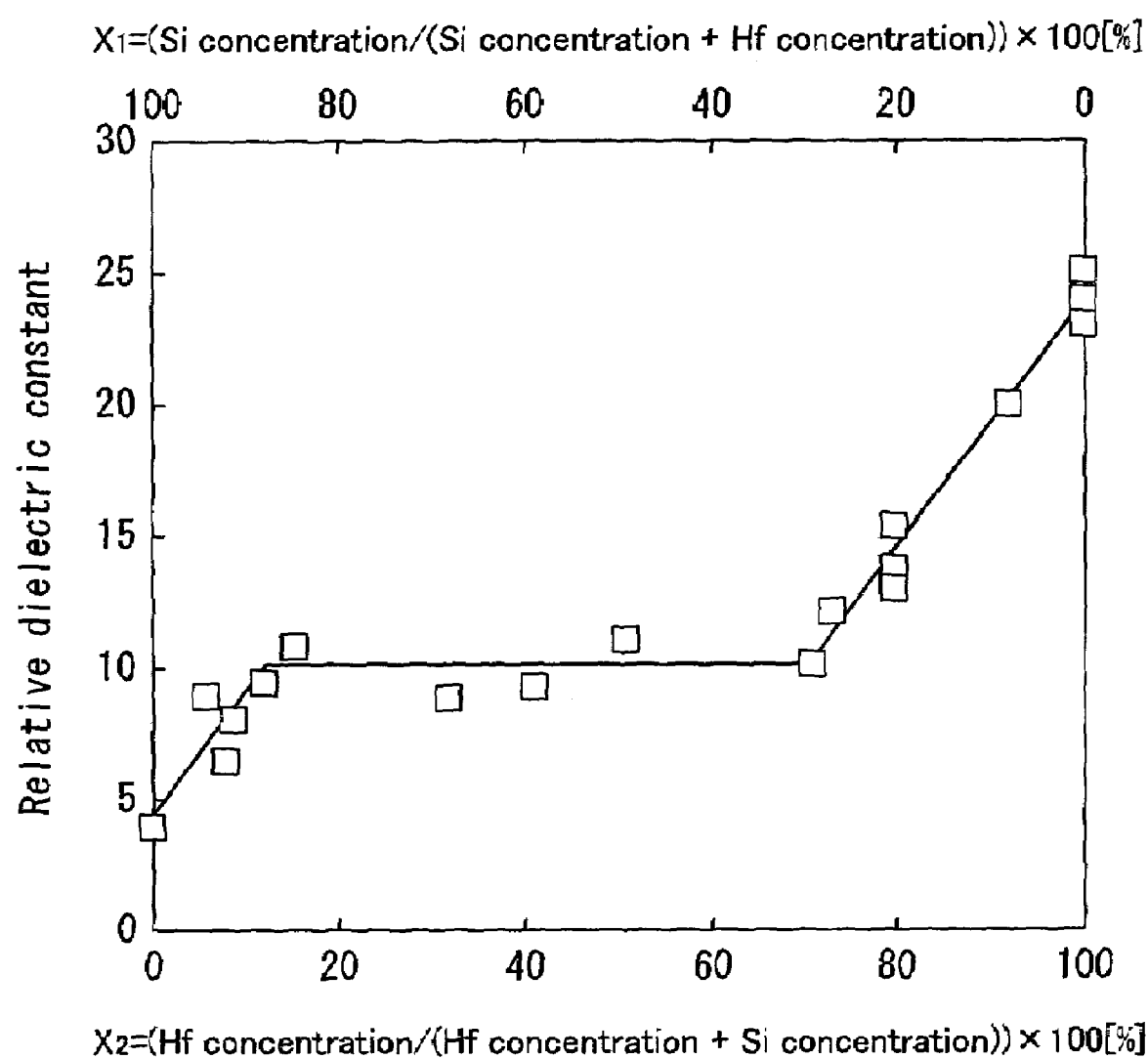
FIG. 4 is a graph showing the relationship between the amount of Si added to a $HfO_2$ film and the relative dielectric constant of the $HfO_2$ film.

FIG. 4 shows the relationship between the amount of Si added to the $HfO_2$ film and the relative dielectric constant of the $HfO_2$ film. In FIG. 4, the upper horizontal axis shows $X_1$=(Si concentration/(Si concentration+Hf concentration))×100 as described above, which indicates the Si amount. The lower horizontal axis shows $X_2$=(Hf concentration/(Si concentration+Hf concentration))×100 as described above, which indicates the Hf amount. The vertical axis shows the relative dielectric constant of the $HfO_2$ film. □ shows the value obtained by an actual measurement of the relative dielectric constant.

As shown in FIG. 4, when $X_1$ is 0% (that is, when the film is the $HfO_2$ film, which contains no Si), the relative dielectric constant of the $HfO_2$ film is about 24, which is the maximum. The relative dielectric constant decreases as the Si amount in the $HfO_2$ film increases, but the relative dielectric constant is substantially constantly about 11 when $X_1$ is between 30% and 90%. When the Si amount in the $HfO_2$ film further increases and exceeds 90%, the relative dielectric constant gradually decreases again, and the relative dielectric constant is about 3.9 when $X_1$ is 100%/o (that is, when the film is the $SiO_2$ film, which contains no Hf). Therefore, when $X_1$ is 90% or less, that is, when $X_2$ is 10% or more, a Hf silicate film having a comparatively high and stable relative dielectric constant can be realized.

According to the results shown in FIGS. 2 to 4 described above, it is important to set $X_1$=(Si concentration/(Si concentration+Hf concentration))×100 in the high dielectric constant film 11a made of silicon-containing $HfO_2$ to 23% or more, and 90% or less in order that the high dielectric constant film 11a (which may be a stacked structure of a combination of the high dielectric constant film 11a, the lower barrier film 11b and/or the upper barrier film 11c, instead of the high dielectric constant film 11a) has the thermal stability while having a high relative dielectric constant.

$X_1$=(Si concentration/(Si concentration+Hf concentration))×100 has the same meaning as (y/(x+y))×100 when the composition of the high dielectric constant 11a is represented as $Hf_xSi_yO$ (where x>0, and y>0). Similarly, $X_2$=(Hf concentration/(Si concentration+Hf concentration))×100 has the same meaning as (x/(x+y))×100. $X_1$ and $X_2$ show the relationship between the Si concentration and the Hf concentration, so that also when Hf silicate to be used contains N in the form of Hf silicate nitride, or when it contains other elements such as Cl, F and H, the above description employing $X_1$ and $X_2$ is effective.

Figure 5:
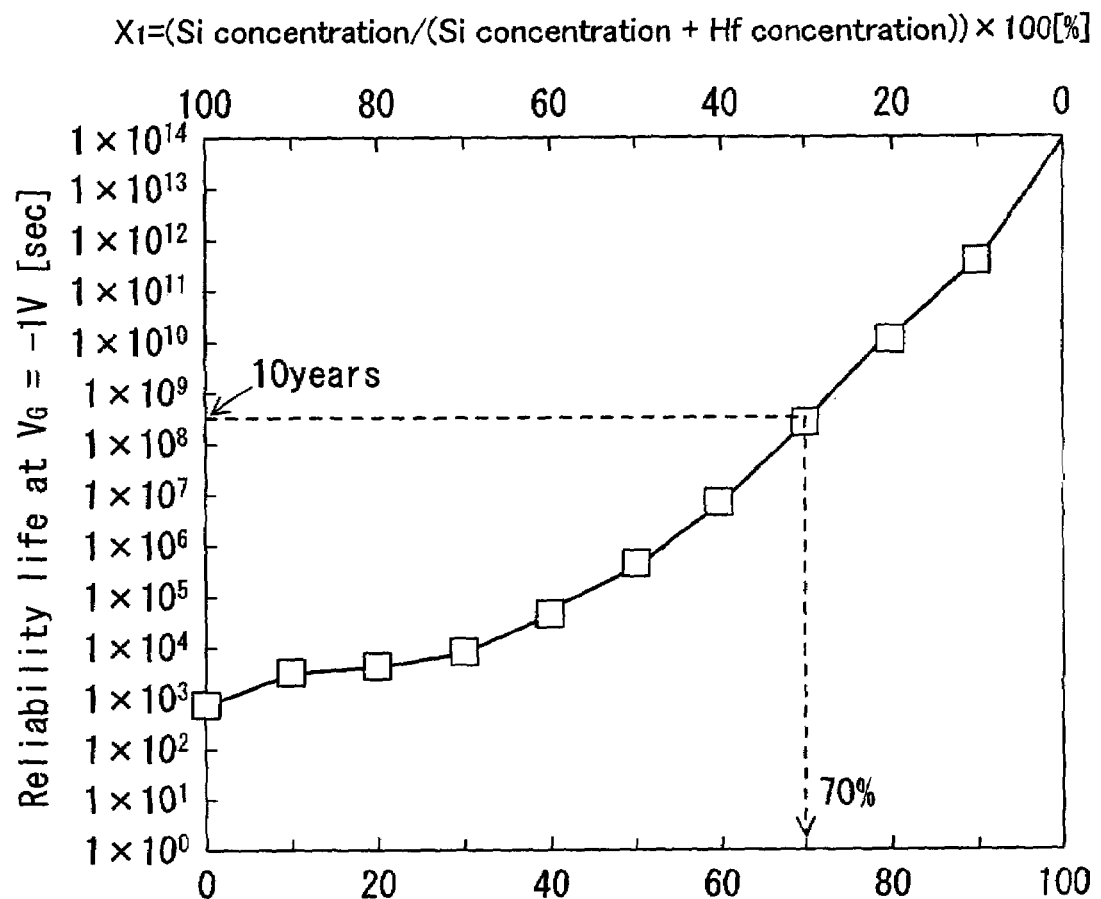
FIG. 5 is a graph showing the relationship between the amount of Si added to a $HfO_2$ film and the reliability life of the $HfO_2$ film.

FIG. 5 shows the relationship between the amount of Si added to the $HfO_2$ film and the reliability life of the $HfO_2$ film (period of time until breakdown occurs). In FIG. 5, the upper horizontal axis shows $X_1$=(Si concentration/(Si concentration+Hf concentration))×100 as described above, which indicates the Si amount. The lower horizontal axis shows $X_2$=(Hf concentration/(Si concentration+Hf concentration))×100 as described above, which indicates the Hf amount. The vertical axis shows the reliability life of the $HfO_2$ film. □ shows the value obtained by an actual measurement of the reliability life.

More specifically, various samples of MOS capacitors having Hf silicate films having different compositions are prepared, and a TDDB (time dependent dielectric breakdown measurement) test is performed to estimate the long term reliability life of the Hf silicate films under the conditions of an incidence of failure of 100 ppm, an insulating film area (MOS area) of 0.1 cm², a temperature of 100° C., an applied voltage $V_G$=−1V, and EOT ($SiO_2$ equivalent thickness)=1.5 nm. The results are shown in FIG. 5. Herein, the composition of the Hf silicate in each sample varies in the range from $SiO_2$, which contains no Hf to $HfO_2$, which contains no Si. Each sample is formed on a p-type substrate, and a constant negative stress voltage is applied to the electrodes, setting 0V on the substrate side.

More specifically, the insulating film area of each sample used in the TDDB test is in the range from $3 \times 10^{-7}$ cm² to $5 \times 10^{-3}$ cm². To obtain the reliability life at an insulating film area of 0.1 cm², the following equation based on the assumption that defects in the insulating film are distributed according to the Poisson distribution was used:

The reliability life of the insulating film area 1
=the reliability life of the insulating film area 2×(insulating film area 2/insulating film area 1) $^{(1/\beta)}$, where β is a Weibull gradient. The temperature during the TDDB test is in the range from room temperature to 100° C. To obtain the reliability life at a temperature of 100° C., activation energy of the reliability life obtained in advance with respect to a temperature change was used. To obtain the reliability life at an incidence of failure of 100 ppm, a Weibull gradient β was obtained based on a Weibull plot obtained by the TDDB test, and then the approximate straight line of an intrinsic breakdown was extended. Furthermore, in the TDDB test, $V_G$ larger than 1 V as an absolute value is used, whereas in order to obtain the reliability life at $V_G$=−1 V, experiment data of the reliability life corresponding to a real electric field Eox (real) that is obtained from an equation of ($V_G$ (at the time of the TDDB test)−Vfb)/Tph, where Vfb is a flat band voltage, and Tph is the physical thickness of the entire insulating film, were extended by the straight-line approximation.

According to the results shown in FIG. 5 obtained using the above-described method, when $X_1$ (upper horizontal axis) is 30% or less, that is, when $X_2$ is 70% or more, the reliability life of the Hf silicate film is 10 years or more. The results shown in FIG. 5 are those obtained by estimating the reliability life on the lower voltage side with respect to the real electric field Eox (real). The results obtained by estimating the reliability life on the lower voltage side with respect to the $V_G$ itself at the time of the TDDB test or the effective electric field Eox (effective) obtained by an equation of ($V_G$ (at the time of TDDB test)−Vfb)/EOT exhibit the similar tendency.

According to the results shown in FIGS. 2 to 4, when thermal stability and a high relative dielectric constant are targeted, it is preferable to set $X_1$=(Si concentration/(Si concentration+Hf concentration))×100 to 23% or more and 90% or less. On the other hand, according to the results shown in FIG. 5, when $X_1$ is 30% or less, the reliability life of 10 years or more can be obtained. That is to say, when reliability as well as thermal stability and a high relative dielectric constant are targeted, the preferable range of $X_1$ is 23% or more and 30% or less. However, in the case of a process that does not require a high temperature treatment after a gate insulating film is formed, such as a replacement gate process (process that allows a gate electrode to be formed after formation of source and drain regions by using a dummy gate), more specifically, in the case of a process that does not require a heat treatment at 750° C. or more after a gate electrode is formed, it is sufficient to target only reliability, so that the preferable range of $X_1$ is 30% or less.

FIG. 6 shows the relationship between the amount of Si added to the $HfO_2$ film and the thermal stability and the reliability of the $HfO_2$ film.

As shown in FIG. 6, the preferable range of the structure (composition) of the high-k gate insulating film made of a $HfO_2$ film containing Si or the process temperature can be divided roughly into three regions. To be specific, when only thermal stability is targeted, the preferable range is below $T=6.69 \cdot X_1+749.4$. In order to obtain a comparatively high relative dielectric constant in the maximum process temperature of 900° C. as well, $X_1$ has to be set to 23% or more and 90% or less. In the case of a process that does not require a high temperature treatment after a gate insulating film is formed, such as a case using a replacement gate, it is sufficient to target only reliability, so that it is sufficient to set $X_1$ to 30% or less. Furthermore, in a conventional Si process, when a high-k material is used as the gate insulating film material instead of SiON, and Poly-Si or SiGe or the like is used as the gate electrode material, that is, when annealing for activating impurities is performed at a comparatively high temperature after a gate insulating film is formed, it is necessary to target both thermal stability and reliability, so that the range that is below $T=6.69 \cdot X_1+749.4$ and satisfies that $X_1$ is 30% or less is preferable. In this case, when the maximum process temperature is 900° C., $X_1$ has to be set to 23% or more and 30% or less. It should be noted that 900° C. is a typical temperature in annealing for activating impurities contained in a source region, a drain region or an electrode.

As described above, according to the first embodiment, the high dielectric constant film 11a included in the gate insulating film 11 is a $HfO_2$ film containing silicon, so that the high electric constant film 11a can be prevented from being crystallized by a high temperature treatment in the production process. Therefore, in a finished semiconductor device, the high dielectric constant film 11a remains mostly amorphous, so that leak current can be suppressed from occurring in the gate insulating film 11, that is, the high-k gate insulating film. Consequently, the thermal stability of the gate insulating film 11 can be improved, so that a semiconductor device having excellent heat resistance can be realized, and the process margin in the production of the semiconductor device can be increased.

Furthermore, according to the first embodiment, the lower barrier film 11b containing silicon, nitrogen and oxygen is present below the high dielectric constant film 11a in the gate insulating film 11, so that the high dielectric constant film 11a and the silicon substrate 10 can be prevented from being reacted with each other. Herein, the lower barrier film 11b prevents the silicon substrate 10 from being oxidized by oxygen in the high dielectric constant film 11a. That is to say, when an oxide film having a relative dielectric constant substantially equal to that of a $SiO_2$ film is formed on the surface of the silicon substrate 10 as an interface layer, the relative dielectric constant of the gate insulating film 11 as a whole decreases significantly, and therefore the lower barrier film 11b is provided.

Furthermore, according to the first embodiment, the lower barrier film 11b contains the same metal as in the high dielectric constant film 11a, specifically, hafnium, so that the relative dielectric constant of the lower barrier film 11b can be higher than that of a regular silicon oxynitride film, so that the relative dielectric constant of the gate insulating film 11 as a whole can be made higher. More specifically, as shown in FIG. 4, when hafnium is introduced into the lower barrier film 11b in a ratio of 10% or more with respect to silicon (that is $X_2 \geq 10\%$), so that the relative dielectric constant of the lower barrier film 11b can increase effectively. On the other hand, as shown in FIG. 4, when the silicon content in the lower barrier film 11b is too large (more specifically, $X_1 \geq 90\%$), the relative dielectric constant decreases drastically. In other words, it is very effective to set the Hf concentration in the lower barrier film 11b to be higher than $X_2=0\%$ even to a slight extent in order to reduce the EOT of the entire gate insulating film 11.

Furthermore, according to the first embodiment, the upper barrier film 11c is present in a portion above the high dielectric constant film 11a in the gate insulating film 11, so that the material of the gate electrode 12 (polysilicon in this embodiment) is prevented from being mixed with the material of the high dielectric constant film 11a (e.g., hafnium) more than necessary, and thus a reduction of the relative dielectric constant of the gate insulating film 11 can be suppressed. In this case, the barrier effect of the upper barrier film 11c can be improved by allowing the upper barrier film 11c to contain nitrogen. The relative dielectric constant of the upper barrier film 11c can be increased by allowing the upper barrier film 11c to contain the same metal, hafnium, as the high dielectric constant film 11a, and thus the relative dielectric constant of the entire gate insulating film 11 can be increased.

In the first embodiment, it is preferable to set $X_1$=(Si concentration/(Si concentration+Hf concentration))×100 in the high dielectric constant film 11a (which may be a stacked structure of a combination of the high dielectric constant film 11a, the lower barrier film 11b and/or the upper barrier film 11c, instead of the high dielectric constant film 11a) to 23% or more and 90% or less. By doing this, the relative dielectric constant of the high dielectric constant film 11a can be increased and even if a heat treatment at about 900° C. is performed, the high dielectric constant film 11a can be suppressed from being crystallized, so that an increase of leak current due to defects or the like can be prevented. In other words, the thermal stability of the gate insulating film 11 can be ensured while the relative dielectric constant of the gate insulating film 11 is kept sufficient. In this case, it is more preferable to set $X_1$ in the high dielectric constant film 11a to 23% or more and 30% or less. By doing this, in addition to the above-described advantages, a sufficient reliability life of the high dielectric constant film 11a, that is, the gate insulating film 11 can be obtained. When the maximum process temperature is reduced to be significantly low by the use of a replacement gate or the like, merely setting $X_1$ to 30% or less ensures the thermal stability of the gate insulating film 11 while ensuring sufficient relative dielectric constant and reliability life of the gate insulating film 11.

In the first embodiment, $HfO_2$ is used as the high dielectric constant material included in the gate insulating film 11, but instead of this material, $ZrO_2$, $TiO_2$, $Ta_2O_5$, $La_2O_3$, $CeO_2$, $Al_2O_3$, or BST (barium strontium titanium oxide) or the like can be used. Alternatively, ternary oxide such as $Hf_xAl_yO_2$, where x>0, and y>0) can be used. Alternatively, metal silicate in which Si atoms are contained in the above-listed metal oxides can be used.

In the first embodiment, the lower barrier film 11b and the upper barrier film 11c are provided, but there may be no need of providing the lower barrier film 11b and/or the upper barrier film 11c, depending on the selection of the material of the gate electrode 12.

In the first embodiment, a polysilicon electrode is used as the gate electrode 12, but instead of this, a so-called metal gate electrode made of a metal film such as a stacked film of a TiN film and a Al film (TiN film as the lower film), a Ta film, a TiN film or a TaN film can be used. If a metal film such as a TiN film or TaN film is used as the metal gate electrode material, Si or Ge can be mixed with the metal film.

Second Embodiment

Hereinafter, a method for producing a semiconductor device of a second embodiment of the present invention, specifically, a method for producing a MISFET will be described with reference to the accompanying drawings.

FIGS. 7A to 7C and 8A to 8C are cross-sectional views showing the processes of a method for producing a semiconductor device of the second embodiment.

Figure 7A:
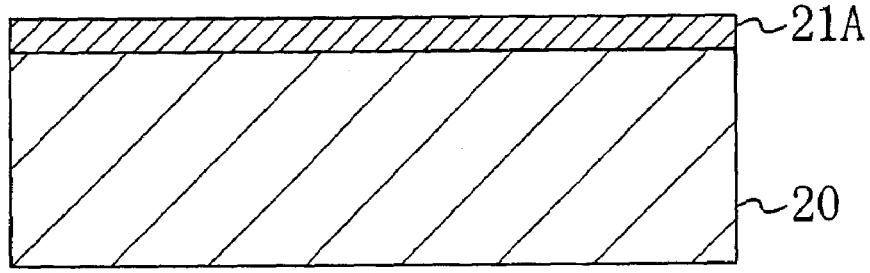
FIGS. 7A to 7C are cross-sectional views showing the processes in a method for producing a semiconductor device according to a second embodiment of the present invention.

First, as shown in FIG. 7A, an insulating film for isolation (not shown) is formed on a p-type silicon (100) substrate 20, and a device forming region is segmented. Then, standard RCA cleaning and diluted HF cleaning are performed with respect to the surface of the silicon substrate 20. Thereafter, a silicon nitride film ($Si_3N_4$ film) 21A having a thickness of about 0.7 nm is formed on the silicon substrate 20 with $NH_3$ gas at a temperature of about 700° C. In this process, sufficient hydrogen is captured in the $Si_3N_4$ film 21A. The $Si_3N_4$ film 21A eventually becomes the lower barrier film 21 (see FIG. 7C).

Figure 7B:
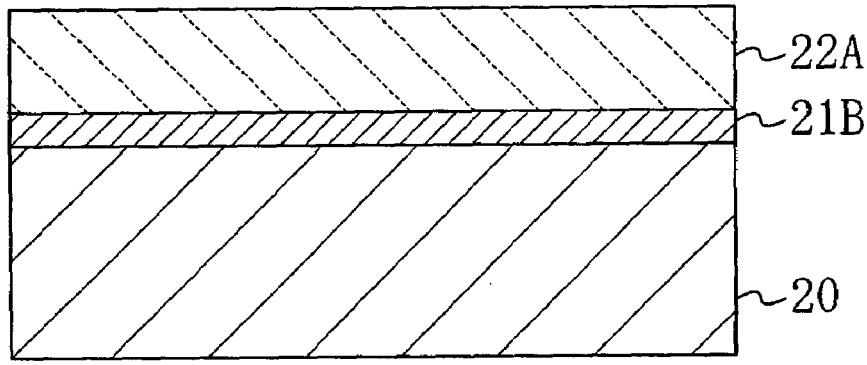

Next, as shown in FIG. 7B, a hafnium oxide ($HfO_2$) film 22A having a thickness of about 5 nm is formed on the silicon substrate 20 by CVD (chemical vapor deposition) employing a source precursor containing hafnium. More specifically, nitrogen ($N_2$) gas as a carrier gas is allowed to pass through Hf-t-butoxide ($C_{16}H_{36}HfO_4$), which is a liquid Hf source, to bubble the Hf-t-butoxide to evaporate the Hf-t-butoxide. Then, a RTCVD (rapid thermal CVD) treatment is performed at a temperature of about 500° C. while the $N_2$ gas containing the evaporated Hf-t-butoxide and dry oxygen ($O_2$) gas as an oxidizing agent are supplied to a chamber in which the silicon substrate 20 (wafer) is placed, and thus a $HfO_2$ film 22A is formed.

In this process, the $Si_3N_4$ film 21A is oxidized by the $O_2$ gas as an oxidizing agent, and turns into a SiON film 21B.

The SiON film 21B has barrier properties for preventing a reaction between the silicon substrate 20 and the $HfO_2$ film 22A and contains sufficient hydrogen. In this embodiment, after the $Si_3N_4$ film 21A is formed on the silicon substrate 20, the $Si_3N_4$ film 21A is oxidized during the formation of the $HfO_2$ film 22A to form the SiON film 21B. However, without forming the $Si_3N_4$ film 21A, the SiON film 21B can be directly formed by nitriding the surface of the silicon substrate 20 with $N_2O$ gas before forming the $HfO_2$ film 22A.

In the process shown in FIG. 7B, hydrogen (H) contained in the Hf source is spontaneously captured in the $HfO_2$ film 22A. On the other hand, carbon (C) contained in the Hf source is oxidized by the $O_2$ gas as an oxidizing agent, so that it is exhausted in the form of CO or $CO_2$ from the chamber. In the chamber, in addition to Hf, O, C, and H, which are constituent elements of the Hf source, $N_2$ gas is present, but the $N_2$ gas is very inert at temperatures below about 500° C., so that an influence of the $N_2$ gas can be ignored.

When the $HfO_2$ film 22A was analyzed by a SIMS method (secondary ion mass spectroscopy), it was found that primary elements constituting the $HfO_2$ film 22A were Hf and O. In the $HfO_2$ film 22A, $3\times10^{19}$ to $4\times10^{20}$ carbon atoms/$cm^3$ and $5\times10^{20}$ to $4\times10^{21}$ hydrogen atoms/$cm^3$ were contained.

Figure 7C:
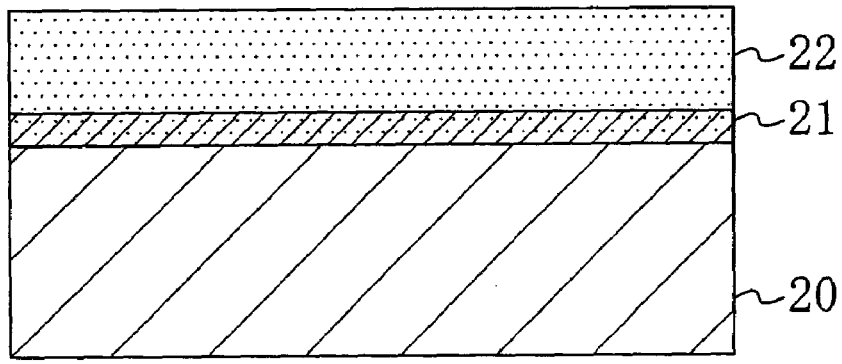

Next, a heat treatment (hereinafter, referred to as PDA (post deposition anneal)) is performed with respect to the $HfO_2$ film 22A. PDA is performed, for example, in a nitrogen atmosphere at about 700° C. for 30 seconds. Now, changes occurring in the stacked structure of the SiON film 21B and the $HfO_2$ film 22A by performing PDA will be described in detail with reference to FIGS. 9A to 9D. As described above, before performing PDA, as shown in FIG. 9A, the SiON film 21B and the $HfO_2$ film 22A contain hydrogen. When PDA is performed, as shown in FIG. 9B, hydrogen is desorbed from the SiON film 21B and the $HfO_2$ film 22A efficiently in the form of hydrogen gas. As a result, as shown in FIG. 9C, vacancies (white circles in FIG. 9C) are formed in the SiON film 21B and the $HfO_2$ film 22A. Then, as shown in FIG. 9D, silicon contained in the silicon substrate 20 or the SiON film 21B is diffused into the $HfO_2$ film 22A through the vacancies, and Hf contained in the $HfO_2$ film 22A is diffused into the SiON film 21B. As a result, as shown in FIG. 7C, a silicon-containing $HfO_2$ film 22 having high thermal stability is formed, and a lower barrier film 21 made of the Hf-containing SiON film having a high relative dielectric constant can be formed. The silicon-containing $HfO_2$ film 22 is formed by making the $HfO_2$ film 22A dense by the diffusion of silicon. The specific composition of the lower barrier film 21 is the same as the lower barrier film 11b of the first embodiment.

In other words, vacancies obtained by desorbing hydrogen from the $HfO_2$ film 22A and the SiON film 21B has the effect of promoting mutual diffusion of Hf and Si. In this case, setting the temperature for PDA to about 700° C. brings about double effects, that is, an effect of promoting hydrogen desorption to facilitate formation of vacancies and an effect of facilitating diffusion of Hf or Si. As a result, one PDA allows Si to be captured in the $HfO_2$ film 22A to form the silicon-containing $HfO_2$ film 22 having high thermal stability, and allows Hf to be captured in the SiON film 21B to form the lower barrier film 21 (Hf-containing SiON film) having a high relative dielectric constant. Therefore, the thermal stability of a gate insulating film 25 (see FIG. 8C) as a whole including the silicon-containing $HfO_2$ film 22 and the lower barrier film 21 can be improved, and consequently the relative dielectric constant of the gate insulating film 25 as a whole can be increased.

Figure 8A:
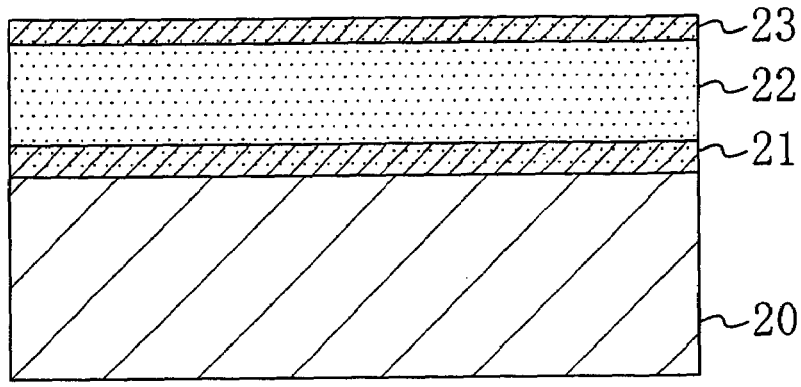
FIGS. 8A to 8C are cross-sectional views showing the processes in a method for producing the semiconductor device according to the second embodiment of the present invention.

Next, the surface of the silicon-containing $HfO_2$ film 22 is nitrided lightly, so that as shown in FIG. 8A, an upper barrier film 23 with a thickness of about 2 nm having a high relative dielectric constant is formed. That is to say, the upper barrier film 23 is formed of the silicon-containing $HfO_2$ film containing nitrogen. The specific composition of the upper barrier film 23 is the same as that of the upper barrier film 11c of the first embodiment.

Figure 8B:
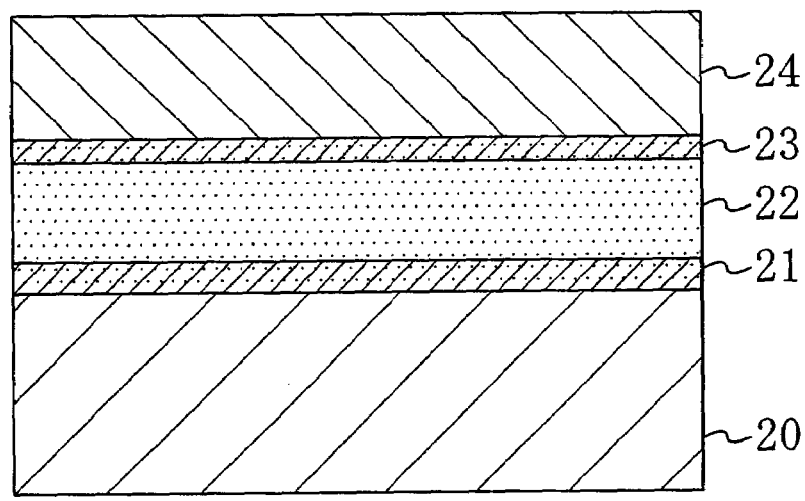
Figure 8C:
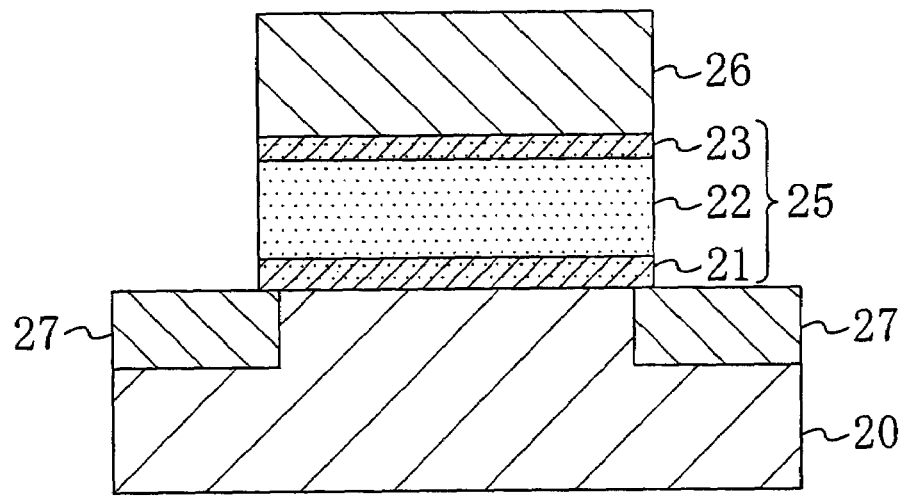

Next, as shown in FIG. 8B, a polysilicon film 24 serving as a gate electrode is formed on the upper barrier film 23 by, for example, CVD. Thereafter, the polysilicon film 24, the upper barrier film 23, the silicon-containing $HfO_2$ film 22, and the lower barrier film 21 are dry-etched sequentially, using a mask pattern (not shown) covering a gate electrode formation region. Thus, as shown in FIG. 8C, a gate electrode 26 is formed on the silicon substrate 20 via the gate insulating film 25 having a stacked structure of the lower barrier film 21, the silicon-containing $HfO_2$ film 22, and the upper barrier film 23. Thereafter, ions are implanted into the silicon substrate 20 with the gate electrode 26 as a mask, so that an impurity diffusion layer 27 serving as a source region or a drain region is formed. Finally, in order to activate impurities in the impurity diffusion layers 27, a heat treatment is performed at about 950° C. for about 30 minutes. The processes described above provide a MIS electric field effect transistor having the high-k gate insulating film.

As described above, according to the second embodiment, the $HfO_2$ film 22A containing hydrogen is formed on the silicon substrate 20, and then a heat treatment (PDA) is performed with respect to the $HfO_2$ film 22A to desorb hydrogen, and silicon is diffused in the $HfO_2$ film 22A through the thus formed vacancies so that the silicon-containing $HfO_2$ film 22 is formed. For this reason, it is possible to allow silicon to be contained efficiently in the $HfO_2$ film 22A and the vacancies eventually disappear so that the silicon-containing $HfO_2$ film 22 becomes dense. In this case, as described in the first embodiment, the silicon-containing $HfO_2$ film 22 is hardly crystallized by a high temperature in the production process, so that the silicon-containing $HfO_2$ film 22 remains mostly amorphous even after a device is complete. As a result, leak current can be suppressed from occurring in the gate insulating film 25 having the silicon-containing $HfO_2$ film 22, that is, the high-k gate insulating film. Therefore, the thermal stability of the high-k gate insulating film is improved, so that a semiconductor device having excellent heat resistance can be realized and the process margin in the production of a semiconductor device can be increased.

Furthermore, according to the second embodiment, before forming the $HfO_2$ film 22A, the $Si_3N_4$ film 21A containing hydrogen is formed on the silicon substrate 20. The $Si_3N_4$ film 21A is oxidized when forming the $HfO_2$ film 22A and turns into the SiON film 21B. Thereafter, when the $HfO_2$ film 22A is subjected to PDA, silicon contained in the SiON film 21B is diffused into the $HfO_2$ film 22A. Moreover, hydrogen is desorbed from the SiON film 21B to form vacancies, and Hf contained in the $HfO_2$ film 22A is diffused into the SiON film 21B through the vacancies, so that the lower barrier film 21 is formed. Therefore, it is ensured that silicon can be contained in the $HfO_2$ film 22A. Furthermore, the $HfO_2$ film 22A or the silicon-containing $HfO_2$ film 22 can be prevented from being reacted with the silicon substrate 20. Furthermore, the lower barrier film 21 contains the same metal, Hf as in the silicon-containing $HfO_2$ film 22, so that the relative dielectric constant of the lower barrier film 21 can be high, and thus the relative dielectric constant of the gate insulating film 25 as a whole can be high.

Moreover, according to the second embodiment, the upper barrier film 23 is formed by nitriding the surface of the silicon-containing $HfO_2$ film 22 in a process between the process for performing PDA to the $HfO_2$ film 22A and the process for forming the polysilicon film 24 serving as the gate electrode 26. Therefore, the material of the gate electrode 26 and material of the silicon-containing $HfO_2$ film 22 are prevented from diffusing each other. Furthermore, the upper barrier film 23 contains the same metal, Hf as in the silicon-containing $HfO_2$ film 22, so that the relative dielectric constant of the upper barrier film 23 can be high, and thus the relative dielectric constant of the gate insulating film 25 as a whole can be high.

Furthermore, according to the second embodiment, the $HfO_2$ film 22A is formed by CVD that employs a source precursor containing hafnium and hydrogen, so that it is ensured that hydrogen can be contained in the $HfO_2$ film 22A.

Hereinafter, the features (e.g., mutual diffusion of Hf and Si by hydrogen desorption) and the effect (e.g., improvement of thermal stability) of the process of performing PDA to the $HfO_2$ film 22A will be described with reference to the drawings showing experiment data or the like.

Figure 10:
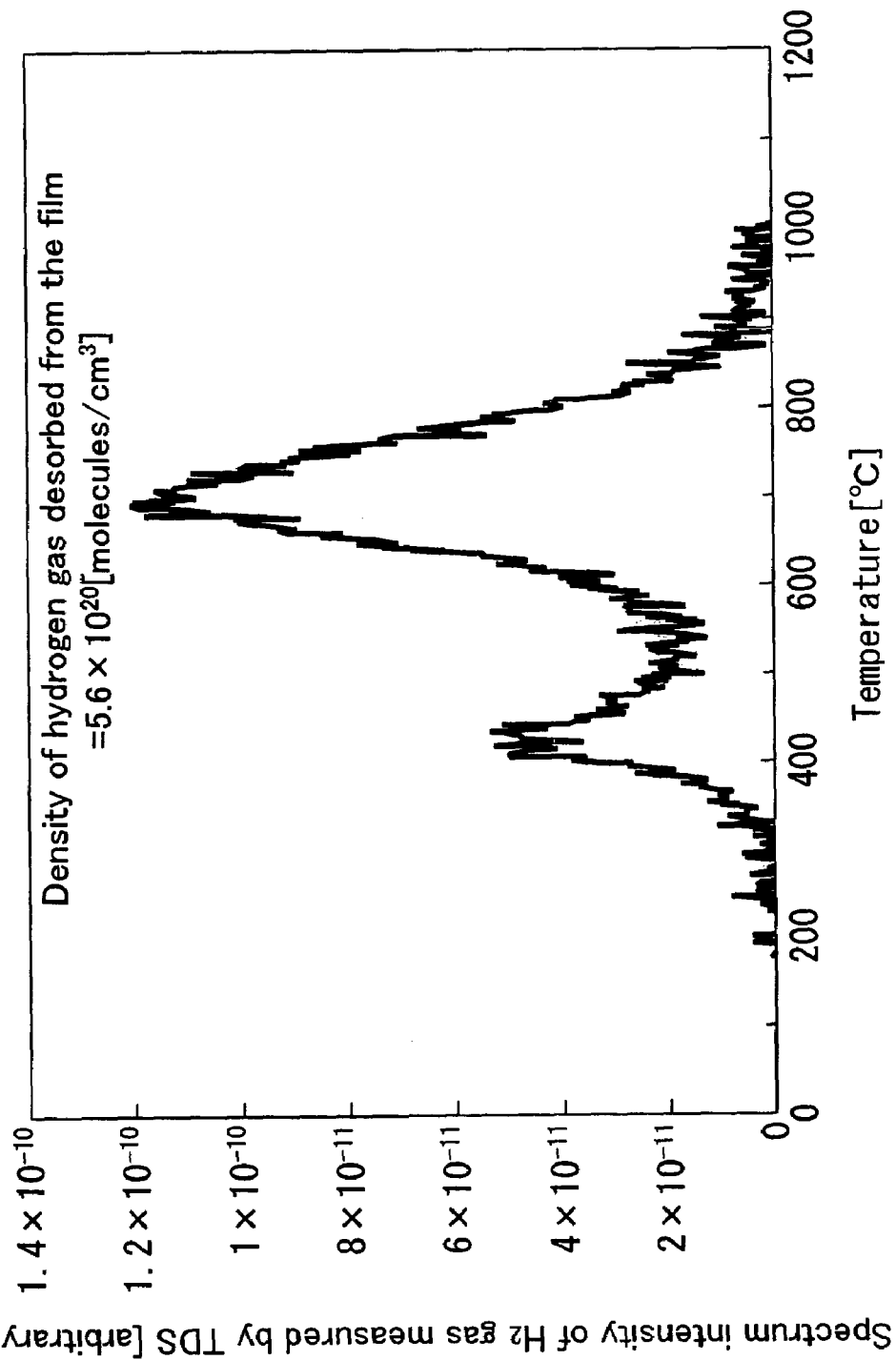
FIG. 10 is a graph showing the results of measurement by TDS regarding hydrogen being desorbing from the $HfO_2$ film due to a heat treatment.

FIG. 10 shows the result of measurement by TDS (thermal desorption spectroscopy) regarding hydrogen that is being desorbed from the $HfO_2$ film by a heat treatment. In FIG. 10, the horizontal axis shows the heat treatment temperature and the vertical axis shows the spectrum intensity of hydrogen gas measured by TDS. As shown in FIG. 10, when the heat treatment temperature reaches about 400° C., first, hydrogen adsorbed on the surface of the $HfO_2$ film starts to be desorbed. Thereafter, when the heat treatment temperature reaches about 700° C., hydrogen contained in the $HfO_2$ film is desorbed. The density of hydrogen molecules that was contained in the $HfO_2$ film just after deposition and eventually desorbed from the $HfO_2$ film by a heat treatment was measured and found to be as high as $5.6 \times 10^{20}$ molecules/cm². According to the results shown in FIG. 10, when the heat treatment temperature is about 700° C., the detected amount of desorbed hydrogen is largest. Therefore, the optimal temperature for PDA is about 700° C., and the thus setting allows excessive hydrogen contained in the $HfO_2$ film to be desorbed so that the $HfO_2$ film can be made dense most effectively.

While performing a heat treatment (temperature increase rate of 10° C./min) in an ultrahigh vacuum with respect to a sample of the $HfO_2$ film formed on a Si substrate by CVD with Hf-t-butoxide, which is a liquid Hf source, the $HfO_2$ film that was being heated were subjected to in-situ observation to see its changes, using a high resolution cross-sectional TEM (transmission electron microscope), and the following was confirmed. At room temperature (immediately after the $HfO_2$ film is formed), an interface layer (corresponding to the SiON film 21B) that contains a large number of Si atoms and a small number of Hf atoms is present on the Si substrate, and the $HfO_2$ layer that contains a small number of Si atoms and a large number of Hf atoms is present on the interface layer. Thereafter, as the temperature increases, in the temperature range from 620° C. to 850° C., a mutual diffusion layer that contains a smaller number of Si atoms than that of the interface layer and a smaller number of Hf atoms than that of the $HfO_2$ layer evidently starts to appear between the interface layer and the $HfO_2$ layer. Finally, when a high temperature annealing is performed at 860° C., the total physical thickness of a stacked structure (corresponding to the silicon-containing $HfO_2$ film 22) of the $HfO_2$ layer and the mutual diffusion layer is larger than that of the $HfO_2$ layer at the time of deposition (room temperature). That is to say, the interface layer is contracted by expansion of the mutual diffusion layer, and as a result, the relative dielectric constant of the entire Hf silicate stacked structure including the interface layer becomes high.

In the case of regular PDA, the temperature increase rate is as high as 50° C./sec, and the retention period at a heat treatment temperature of about 700° C. is as short as 30 seconds, so that the thermal budget (thermal load) is much smaller than that from the in-situ observation during heating by the high resolution cross-sectional TEM. Therefore, oxidation of the Si substrate caused by PDA occurs only 1 nm or less, and the interface layer becomes very thin because of the mutual diffusion of Si and Hf so that the final interface layer (corresponding to the lower barrier film 21) is about 0.5 nm. Thus, the relative dielectric constant of the entire Hf silicate stacked structure including the interface layer becomes high, and as a result, the EOT of the stacked structure as a whole becomes very small. In other words, forming the $HfO_2$ film by CVD employing a Hf source containing hydrogen is very advantageous as a method for forming a high-k gate insulating film. On the other hand, a $HfO_2$ film is formed by CVD employing a regular Hf source free from hydrogen, and an in-situ observation during heating is performed with respect to the $HfO_2$ film with the high resolution cross-sectional TEM. Then, it was found that mutual diffusion hardly occurred between the interface layer and the $HfO_2$ layer. As a result, the thermal stability of the $HfO_2$ layer was not improved and the relative dielectric constant of the stacked structure of the interface layer and the $HfO_2$ layer was not increased.

Figure 11:
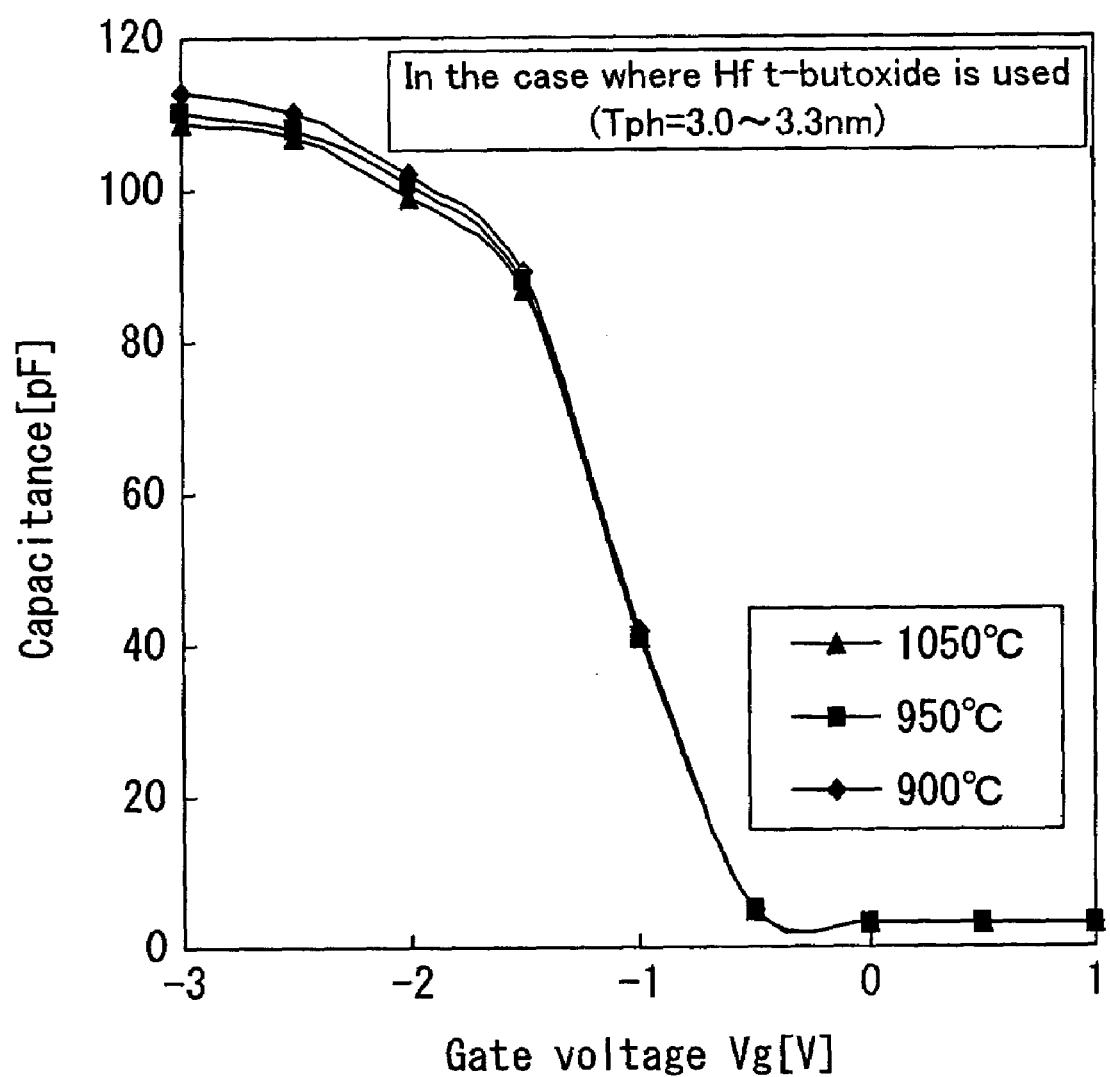
FIG. 11 is a graph showing the results of C-V measurement after a heat treatment with respect to a H-containing $HfO_2$ film formed by CVD using Hf-t-butoxide in the method for producing a semiconductor device according to the second embodiment of the present invention.

FIG. 11 shows the results of C-V measurement after the heat treatment with respect to the $HfO_2$ film containing hydrogen formed by CVD employing Hf-t-butoxide. More specifically, annealing for activating impurities implanted to the gate electrode was performed at 900° C., 950° C. and 1050° C. with respect to samples of a MOS capacitor employing a $HfO_2$ film having a physical thickness of 3.0 to 3.3 nm as the gate insulating film and polysilicon as the gate electrode. Then, a gate voltage Vg was applied with a voltage of 0 V set on the substrate side. In FIG. 11, the horizontal axis shows the gate voltage (Vg) and the vertical axis shows the capacitance. ♦ shows the measured value of the capacitance when a heat treatment was performed at 900° C., ■ shows the measured value of the capacitance when a heat treatment was performed at 950° C., and ▲ shows the measured value of the capacitance when a heat treatment was performed at 1050° C.

As shown in FIG. 11, when the $HfO_2$ film containing hydrogen formed of Hf-t-butoxide is used, stable C-V curve is shown even if the annealing temperature for activation is increased, and the temperature at which the sample can withstand as an ideal MOS capacitor is as high as 1050° C. or more. In other words, in the $HfO_2$ film containing hydrogen, as a result of occurrence of significant mutual diffusion of Hf and Si accompanied by hydrogen desorption caused by PDA, a Si-containing layer is present on the surface side of the $HfO_2$ film. Therefore, also when polysilicon is used as the gate electrode, as shown in FIG. 11, very stable heat resistance is exhibited at about 1050° C.

Figure 12:
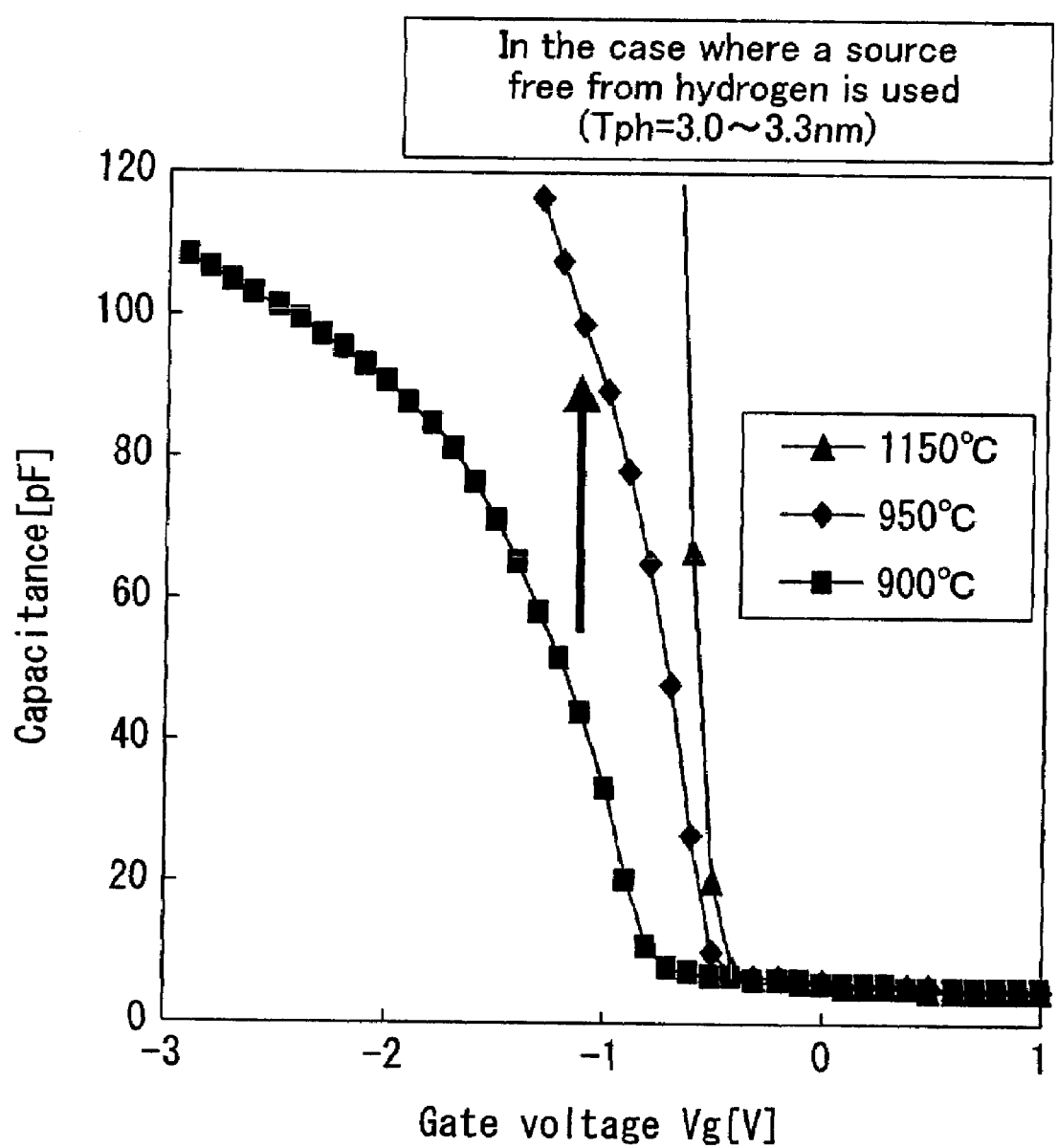
FIG. 12 is a graph showing the result of C-V measurement after a heat treatment with respect to a H-free $HfO_2$ film formed by CVD using a source that does not contain hydrogen as a comparative example.

FIG. 12 shows the result of C-V measurement after a heat treatment with respect to a $HfO_2$ film free from hydrogen formed by CVD employing a source free from hydrogen, specifically, Hf-nitrato ($Hf(NO_3)_4$) as a comparative example. More specifically, annealing for activating impurities implanted to the gate electrode was performed at 900° C., 950° C. and 1150° C. with respect to samples of a MOS capacitor employing a $HfO_2$ film having a physical thickness of 3.0 to 3.3 nm as the gate insulating film and polysilicon as the gate electrode. Then, a gate voltage Vg was applied with a voltage of 0 V set on the substrate side. In FIG. 12, the horizontal axis shows the gate voltage (Vg) and the vertical axis shows the capacitance. ■ shows the measured value of the capacitance when a heat treatment was performed at 900° C., ♦ shows the measured value of the capacitance when a heat treatment was performed at 950° C., and ▲ shows the measured value of the capacitance when a heat treatment was performed at 1150° C.

As shown in FIG. 12, when the $HfO_2$ film free from hydrogen formed of Hf-nitrato is used, the temperature at which the sample can withstand as an ideal MOS capacitor is at most 900° C. Taking the results shown in both FIGS. 11 and 12 into consideration, the thermal stability guarantee temperature when the $HfO_2$ film containing hydrogen is used is 1050° C. or more, whereas the thermal stability guarantee temperature when the $HfO_2$ film free from hydrogen is used is about 900° C. In other words, using the $HfO_2$ film containing hydrogen improves the thermal stability guarantee temperature by 150° C. or more.

Figure 13:
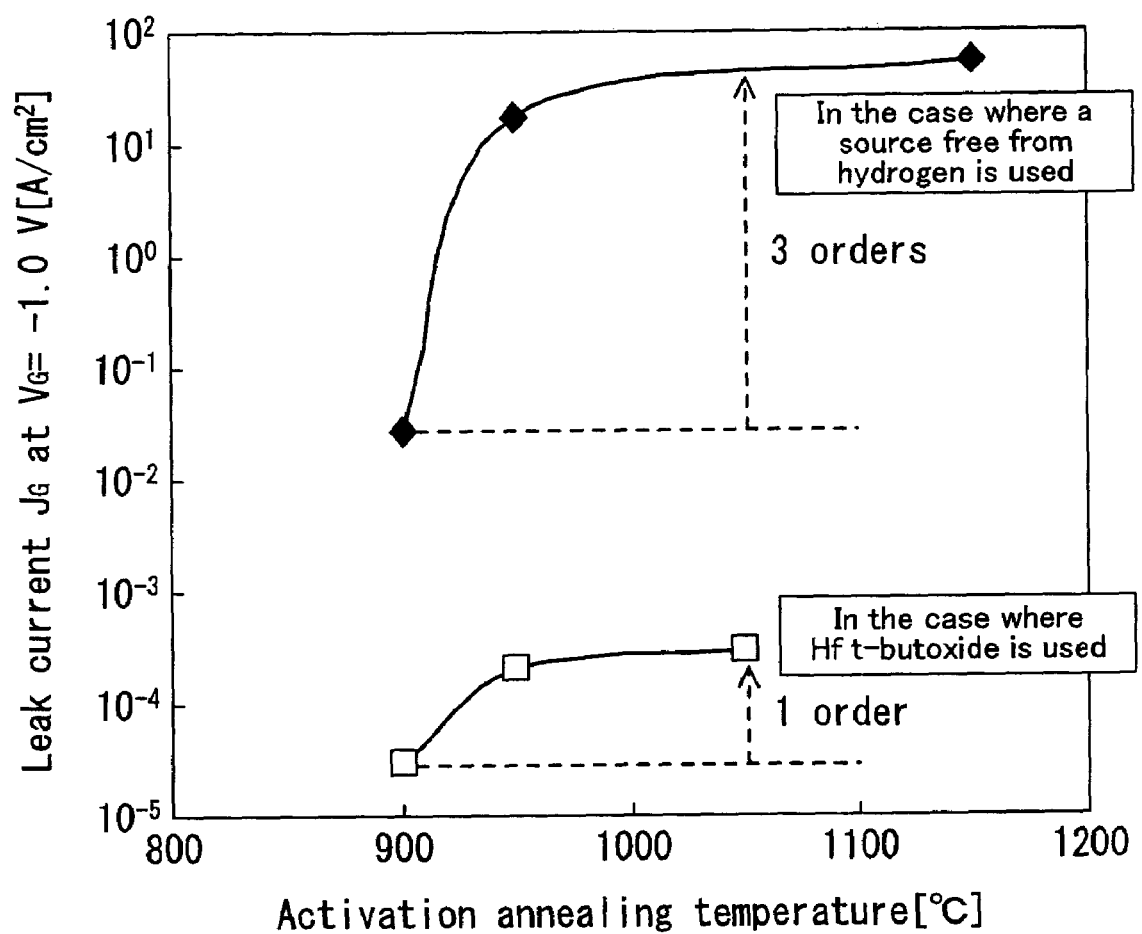
FIG. 13 is a graph showing the results of a comparison in the thermal stability between the case where the H-containing $HfO_2$ film (the second embodiment of the present invention) is used and the case where the H-free $HfO_2$ film (comparative example) is used in a MOS capacitor having a layered structure of Si substrate/SiN film/HfO$_2$ film/polysilicon film.

FIG. 13 shows the results of comparison in the thermal stability between the case where a $HfO_2$ film containing hydrogen was used and the case where a $HfO_2$ film free from hydrogen was used in a MOS capacitor having a stacked structure of Si substrate/SiN film/$HfO_2$ film/polysilicon film. More specifically, annealing for activation was performed at temperatures in the range from 900° C. to 1150° C. for 30 seconds in a nitrogen atmosphere with respect to each MOS capacitor sample. Then, a gate voltage ($V_G$) of −1.0 V was applied with a voltage of 0 V set on the substrate side, and leak current $J_G$ was measured. The $HfO_2$ film containing hydrogen was formed of Hf-t-butoxide, and the $HfO_2$ film free from hydrogen was formed of a source free from hydrogen. In FIG. 13, the horizontal axis shows the activation annealing temperature, and the vertical axis shows the leak current $J_G$. ♦ shows the measured value of the leak current $J_G$ when a source free from hydrogen is used, and □ shows the measured value of the leak current $J_G$ when Hf-t-butoxide was used.

As shown in FIG. 13, when the $HfO_2$ film containing hydrogen formed of Hf-t-butoxide was used and the annealing temperature for activation was increased, an increase of the leak current $J_G$ could be restricted to only one order. On the other hand, in the case where the $HfO_2$ film free from hydrogen was used and the annealing temperature for activation was increased, the leak current $J_G$ was increased by about three orders, that is, about 1000 times larger than in the case of the $HfO_2$ film containing hydrogen. In other words, using the $HfO_2$ film containing hydrogen can reduce the defect production probability to about 1/1000 of that in the case where the $HfO_2$ film free from hydrogen.

Each of the $HfO_2$ film containing hydrogen and the $HfO_2$ film free from hydrogen was deposited on a silicon substrate to the same physical thickness (3 nm), and the EOT of the $HfO_2$ film including the interface layer was measured. The results were as follows. The EOT was 1.1 nm when the $HfO_2$ film containing hydrogen was deposited, and the EOT was 1.6 nm when the $HfO_2$ film free from hydrogen was deposited. That is to say, the relative dielectric constant when the $HfO_2$ film containing hydrogen was deposited was about 1.46 times higher than that when the $HfO_2$ film free from hydrogen was deposited. This is caused by the fact that when the $HfO_2$ film containing hydrogen was deposited, Si and Hf are diffused mutually between the interface layer and $HfO_2$ layer so that Hf is contained in the interface layer, and consequently the relative dielectric constant in the interface layer portion is reduced significantly.

A $HfO_2$ film containing hydrogen having a thickness of 3.5 nm was formed on a silicon substrate, and then a PDA treatment (800° C., 30 seconds) was performed with respect to the $HfO_2$ film. Thereafter, Si, 0 and Hf were measured from the surface side of the $HfO_2$ film by XPS (X-ray photoelectron spectroscopy) using MgKa radiation and the composition of the $HfO_2$ film after the PDA treatment was found to be 0.6 for Hf, 0.49 for Si and 2.0 for O. It should be noted that since primarily the surface of the $HfO_2$ film was observed for measurement by the XPS technique, the detection depth was set to about 2 to 3 nm by detecting photoelectrons having an escape angle of 57 degrees with respect to the surface of the substrate. The results as described above indicate that in the $HfO_2$ film after the PDA treatment, Si has been diffused up to the vicinity of the surface.

Figure 14:
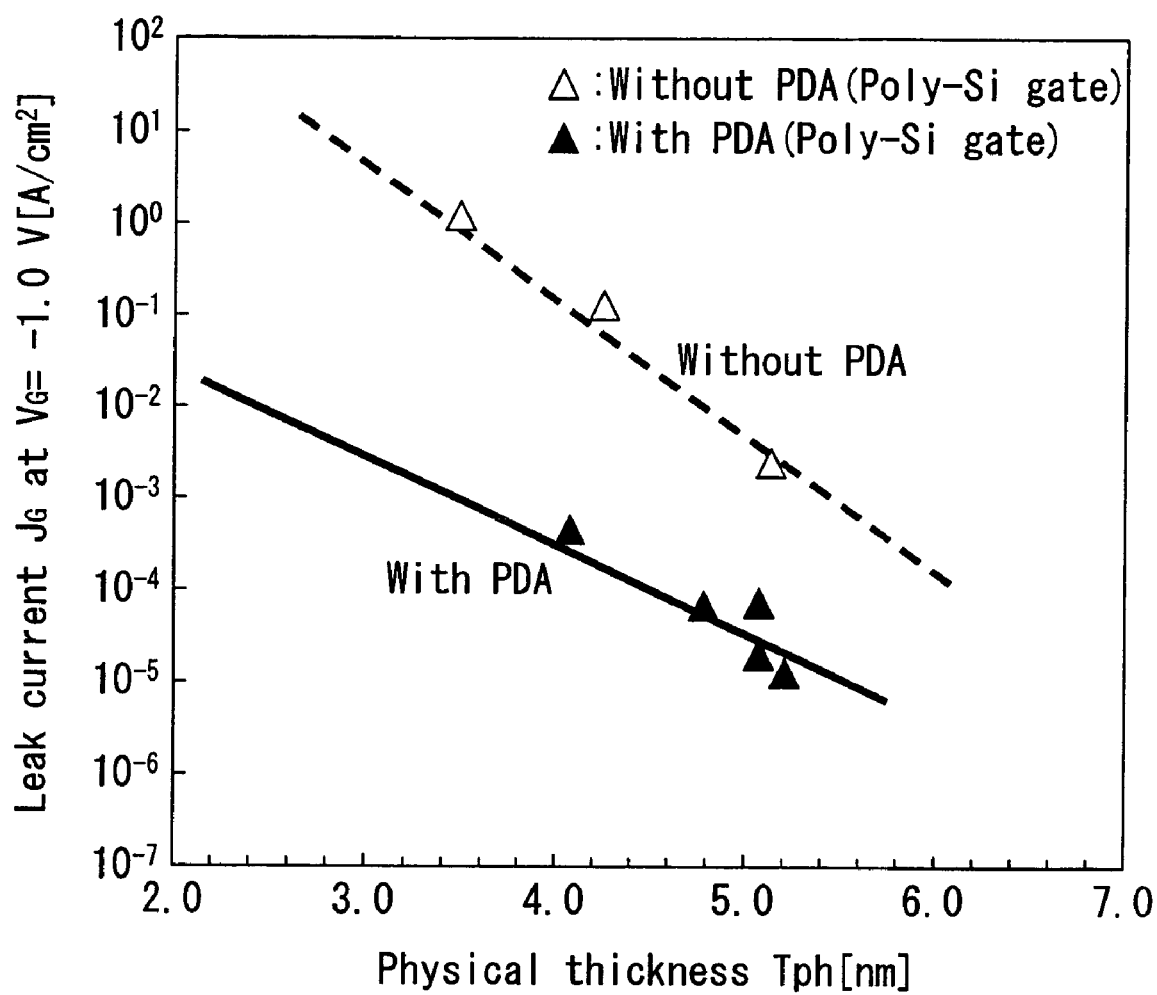
FIG. 14 is a graph showing the relationship between the physical thickness of a HfO$_2$ film that has just formed and the leak current after a MOS capacitor is complete in the case where PDA in the method for producing a semiconductor device of the second embodiment of the present invention is performed with respect to the HfO$_2$ film, which is an insulating film of the MOS capacitor.

FIG. 14 shows the relationship between the physical thickness of the $HfO_2$ film immediately after being formed and the leak current after a MOS capacitor was complete in the case where PDA was performed with respect to the $HfO_2$ film (containing hydrogen), which is the insulating film of the MOS capacitor. More specifically, after a $HfO_2$ film containing hydrogen was formed by CVD, PDA was performed to the $HfO_2$ film in a nitrogen atmosphere at pressure of about 60000 Pa (450 torr) at 800° C. for 30 seconds. Thereafter, a polysilicon film that was to serve as a gate electrode was deposited. Then, after ions were implanted into the polysilicon film, annealing for activation is performed in a nitrogen atmosphere at a pressure of about 110000 Pa (760 torr) at 900° C. for 30 seconds. Thereafter, a gate voltage ($V_G$) of −1.0 V was applied with 0 V on the substrate side, and the leak current $J_G$ was measured. The physical thickness of the $HfO_2$ film immediately after being formed is measured by an ellipsometry method (polarization method). For comparison, with respect to samples of MOS capacitors obtained by omitting the process of performing PDA with respect to the $HfO_2$ film, the relationship between the physical thickness of the $HfO_2$ film immediately after being formed and the leak current after the MOS capacitor was produced was investigated.

As shown in FIG. 14, when PDA is performed, a smaller leak current $J_G$ is achieved than when PDA is not performed. This seems to be caused for the reason as follows: Si is diffused to the $HfO_2$ film by the PDA, which prevents the $HfO_2$ film from being crystallized by annealing for activation, therefore the $HfO_2$ film in the finished MOS capacitor remains mostly amorphous, so that the gate leak current can be suppressed from increasing. Furthermore, it seems that the gate leak current has been reduced also by the fact that a reaction between the electrode material and the material of the high dielectric constant film has been suppressed by achieving a dense silicon-containing $HfO_2$ film. As shown in FIG. 14, the effect of suppressing the gate leak current in the case where PDA is performed is exhibited more significantly as the physical thickness of the $HfO_2$ film is smaller. The above results have confirmed that it is very important to provide a process of performing PDA (post deposition anneal) with respect to the high dielectric constant film after the high dielectric constant film that will serve as a gate insulating film is deposited and before a gate electrode is formed in order to reduce the leak current effectively.

In the second embodiment, a polysilicon film 24 is used as the gate electrode 26, but a metal film can be used instead. For example, the surface of the silicon-containing $HfO_2$ film 22 is nitrided, and then a TiN film and an Al film that will serve as the gate electrode 26 may be deposited sequentially by sputtering. Alternatively, after the surface of the silicon-containing $HfO_2$ film 22 is nitrided, a Ta film that will serve as the gate electrode 26 may be deposited. Alternatively, a TiN film, a TaN film or the like may be deposited without nitriding the surface of the silicon-containing $HfO_2$ film 22. In this case, Si or Ge can be mixed with the Ti film, the TaN film or the like. When a metal film is used as the gate electrode 26 as described above, after the metal film is formed, defects in the gate insulating film 25 can be reduced further by further applying a heat treatment (PMA: post metalization anneal). When a C-V measurement is performed with respect to the thus formed MOS structure, it is confirmed that the amount of the defects in the insulating film and the corresponding hysteresis are reduced. A temperature of 700° C. or more is effective as the temperature of PMA. When annealing is performed in a gas containing hydrogen at 450° C. for about 30 minutes, the interface state in the gate insulating film 25 can be reduced.

In the second embodiment, a $HfO_2$ film is used as the high dielectric constant material constituting the gate insulating film 25, $ZrO_2$, $TiO_2$, $Ta_2O_5$, $La_2O_3$, $CeO_2$, $Al_2O_3$, or BST (barium strontium titanium oxide) can be used instead. Alternatively, ternary oxide such as $Hf_xAl_yO_2$, where x>0 and y>0) can be used. Alternatively, metal silicate in which Si atoms are contained in metal oxide as described above can be used. In any case, the effect of mutual diffusion in the high dielectric constant film containing hydrogen can be realized regardless of the composition or the constituent materials at the time of the deposition of the high dielectric constant film.

In the second embodiment, the $HfO_2$ film 22A is deposited by CVD employing Hf-t-butoxide, which is a liquid Hf source precursor. However, instead of this, when CVD is used, other Hf source precursors containing hydrogen and hafnium such as tetrakis diethylamido hafnium, (TDEAH: $C_{16}H_{40}N_4Hf$), tetrakis dimethylamino hafnium (TDMAH: $C_{16}H_{36}HfO_4$), or tetrakis 1-methoxy-2-methyl-2-propoxy hafnium (Hf(MMP)$_4$: Hf[OC(CH$_3$)$_2$CH$_2$OCH$_3$]$_4$) can be used. Alternatively, a $HfO_2$ film can be formed by CVD employing a solid Hf source precursor such as Hf-nitrato (Hf(NO$_3$)$_4$) and a source gas containing hydrogen such as hydrogen gas. Alternatively, when PVD (physical vapor deposition) such as sputtering is used, a target containing hafnium can be used in an atmosphere containing hydrogen. More specifically, a hafnium target can be used in an atmosphere containing oxygen gas and argon gas to which hydrogen gas is added, or a hafnium oxide target can be used in an atmosphere containing argon gas to which hydrogen gas is added. Hydrogen gas is added for hydrogen to be captured in the high dielectric constant film ($HfO_2$ film).

In the second embodiment, hydrogen is captured in the $HfO_2$ film 22A or the $Si_3N_4$ film 21A as a predetermined substance (substance for vacancy formation), but instead of this, for example, chlorine, fluorine, or iodine can be captured using a halogen-based gas. Any substances can be used as the substance for vacancy formation, as long as it can be desorbed from the $HfO_2$ film 22A or the $Si_3N_4$ film 21A in the form of gas at a temperature of about 600 to 850° C. and can promote the diffusion of Hf or Si through the thus formed vacancies. Furthermore, the substance for vacancy formation for the $HfO_2$ film 22A may be different from that for the $Si_3N_4$ film 21A.

In the second embodiment, the $Si_3N_4$ film 21A, that is, the lower barrier film 21 can be formed by performing, for example, thermal nitridation or plasma nitridation in a gas containing nitrogen with respect to the silicon substrate 20. Alternatively, the SiON film 21B can be directly formed by nitriding the surface of the silicon substrate 20 with $N_2O$ gas before forming the $HfO_2$ film 22A without forming the $Si_3N_4$ film 21A. Alternatively, the high dielectric insulating film containing nitrogen that will become the lower barrier film 21 can be directly formed on the silicon substrate 20 by introducing a gas containing nitrogen in the early stage of the formation of the $HfO_2$ film 22A by evaporation.

In the second embodiment, the upper barrier film 23 can be formed by performing, for example, thermal nitridation or plasma nitridation in a gas containing nitrogen with respect to the silicon-containing $HfO_2$ film 22. Alternatively, the upper barrier film 23 can be formed by nitriding the surface of the silicon-containing $HfO_2$ film 22 by introducing nitrogen gas in the early stage of the formation of the polysilicon film 24 that will serve as the gate electrode 26. Alternatively, the high dielectric insulating film containing nitrogen that will become the upper barrier film 23 can be formed on the side of the surface of the $HfO_2$ film 22A by introducing a gas containing nitrogen in the final stage of the formation of the $HfO_2$ film 22A by evaporation.

In the second embodiment, PDA is performed with respect to the $HfO_2$ film 22A to form the silicon-containing $HfO_2$ film 22, and then the upper barrier film 23 is formed by nitriding the surface of the silicon-containing $HfO_2$ film 22. However, instead of this, after the upper barrier film 23 is formed by nitriding the surface of the $HfO_2$ film 22A, PDA is performed with respect to the $HfO_2$ film 22A to form the silicon-containing $HfO_2$ film 22.

In the second embodiment, the entire stacked structure of the lower barrier film 21, the silicon-containing $HfO_2$ film 22 and the upper barrier film 23 may contain nitrogen.

In the second embodiment, it is preferable that in the process shown in FIG. 7B, first, a source such as evaporated Hf-t-butoxide is supplied into a chamber, and then oxygen gas is supplied to the chamber, and thereafter the temperature in the chamber is increased from room temperature and kept in a predetermined temperature range of about 300 to 500° C. This makes it possible that Hf molecules are adsorbed rapidly on the silicon substrate 20 at a low temperature, so that the $HfO_2$ film 22A can be formed uniformly. Furthermore, the incubation time from the start of the supply of the source gas to the start of crystal growth of the $HfO_2$ film can be shortened. Furthermore, the interface layer (SiON film 21B) formed between the $HfO_2$ film 22A and the silicon substrate 20 can be thin.

In the second embodiment, it is preferable that the temperature for the heat treatment in PDA in the process shown in FIG. 7C is 600° C. or more and 850° C. or less. This ensures that hydrogen can be desorbed from the $HfO_2$ film 22A and thus silicon can be diffused in the $HfO_2$ film 22A.

In the second embodiment, it is preferable to satisfy $T \leq 6.69 \cdot y/(x+y)+749.4$, where the composition of the silicon-containing $HfO_2$ film 22 is expressed as $Hf_xSi_yO$, where x>0, and y>0, and the maximum temperature in the production process is expressed as T [° C.]. This ensures the thermal stability of the gate insulating film 25 having the silicon-containing $HfO_2$ film 22. When the gate electrode 26 is made of a material containing silicon, it is preferable to satisfy $T \leq 6.69 \cdot y/(x+y)+749.4$, and $y/(x+y) \leq 0.30$. This ensures the thermal stability and the reliability of the gate insulating film 25 having the silicon-containing $HfO_2$ film 22.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device, comprising:
   a gate insulating film formed on a substrate; and
   a gate electrode formed on the gate insulating film;
   the gate insulating film comprising:
   a high dielectric constant film containing a metal, oxygen and silicon; and
   a lower barrier film formed below the high dielectric constant film and containing the metal, oxygen, silicon and nitrogen, wherein $0.23 \leq y/(x+y) \leq 0.90$ when a composition of the high dielectric constant film is expressed as $M_xSi_yO$, where M, O and Si represent the metal, oxygen and silicon, respectively, and x>0 and y>0.

2. The semiconductor device according to claim 1, wherein the gate insulating film comprises an upper barrier film formed above the high dielectric constant film, and
   the upper barrier film contains the metal, oxygen and nitrogen.

3. The semiconductor device according to claim 1, wherein the gate insulating film comprises an upper barrier film formed above the high dielectric constant film, and
   the upper barrier film contains the metal, oxygen, silicon and nitrogen.

4. The semiconductor device according to claim 1, wherein the gate electrode is a metal gate electrode.

5. The semiconductor device according to claim 1, wherein the lower barrier film is a silicon oxynitride film including the metal.

6. The semiconductor device according to claim 1, wherein the high dielectric constant film contains nitrogen.

7. A semiconductor device, comprising:
   a gate insulating film formed on a substrate; and
   a gate electrode formed on the gate insulating film;
   the gate insulating film comprising:
   a high dielectric constant film containing a metal, oxygen and silicon; and
   a lower barrier film formed below the high dielectric constant film and containing the metal, oxygen, silicon and nitrogen, wherein $0.23 \leq y/(x+y) \leq 0.30$ when a composition of the high dielectric constant film is expressed as $M_xSi_yO$, where M, O and Si represent the metal, oxygen and silicon, respectively, and x>0 and y>0.

8. A semiconductor device, comprising:
   a gate insulating film formed on a substrate; and
   a gate electrode formed on the gate insulating film;
   the gate insulating film comprising:
   a high dielectric constant film containing a metal, oxygen and silicon; and
   a lower barrier film formed below the high dielectric constant film and containing the metal, oxygen, silicon and nitrogen, wherein $x/(x+y) \leq 0.10$ when the metal is hafnium or zirconium, and a composition of the lower barrier film is expressed as $M_xSi_yO_zN_w$, where M, O, Si and N represent the metal, oxygen, silicon and nitrogen, respectively, and x>0, y>0, z>0 and w>0.

9. The semiconductor device according to claim 1, wherein the lower barrier film is amorphous.

10. The semiconductor device according to claim 1, wherein the gate electrode is a polysilicon electrode.

11. The semiconductor device according to claim 1, wherein the gate electrode is made of a material containing silicon.

12. The semiconductor device according to claim 1, wherein the high dielectric constant film contains chlorine.

13. The semiconductor device according to claim 1, wherein the high dielectric constant film contains fluorine.

14. The semiconductor device according to claim 1, wherein the high dielectric constant film contains hydrogen.

15. The semiconductor device according to claim 1, wherein the high dielectric constant film contains iodine.

16. The semiconductor device according to claim 1, wherein the high dielectric constant film contains carbon.

17. The semiconductor device according to claim 1, wherein the high dielectric constant film is amorphous.

18. The semiconductor device according to claim 17, wherein the high dielectric constant film contains nitrogen.

19. The semiconductor device according to claim 18, wherein the high dielectric constant film contains crystallites.

20. The semiconductor device according to claim 2, wherein the upper barrier film is amorphous.

21. The semiconductor device according to claim 1, wherein the high dielectric constant film includes a part which is located 1 through 2 nm apart from the gate electrode and which is Hf silicate containing nitrogen.

22. A semiconductor device, comprising:
a gate insulating film formed on a substrate; and
a gate electrode formed on the gate insulating film;
the gate insulating film comprising:
a high dielectric constant film containing a metal, oxygen and silicon, wherein $0.23 \leq y/(x+y) \leq 0.90$ when a composition of the high dielectric constant film is expressed as $M_xSi_yO$, where M, O and Si represent the metal, oxygen and silicon, respectively, and x>0 and y>0.

23. The semiconductor device according to claim 22, wherein the high dielectric constant film contains nitrogen.

24. The semiconductor device according to claim 22, wherein the gate insulating film comprises a lower barrier film formed below the high dielectric constant film, and the lower barrier film contains the oxygen, silicon and nitrogen.

25. A semiconductor device according to claim 22, wherein the gate insulating film comprises an upper barrier film formed above the high dielectric constant film, and the upper barrier film contains the metal, oxygen and nitrogen.

26. A semiconductor device according to claim 22, wherein the gate insulating film comprises an upper barrier film formed above the high dielectric constant film, and the upper barrier film contains the metal, oxygen, silicon and nitrogen.

27. The semiconductor device according to claim 7, wherein the high dielectric constant film contains nitrogen.

28. The semiconductor device according to claim 8, wherein the high dielectric constant film contains nitrogen.

29. The semiconductor device according to claim 1, wherein the metal in the high dielectric constant film is at least one of hafnium or zirconium.

30. The semiconductor device according to claim 1, wherein the metal in the high dielectric constant film is at least one of hafnium, zirconium, titanium, tantalum, lanthanum, cerium, or aluminum.

31. The semiconductor device according to claim 14, wherein $5 \times 10^{20}$ to $4 \times 10^{21}$ hydrogen atoms/cm$^3$ were contained in the high dielectric constant film.

32. The semiconductor device according to claim 17, wherein $3 \times 10^{19}$ to $4 \times 10^{20}$ carbon atoms/cm$^3$ were contained in the high dielectric constant film.

* * * * *

UNITED STATES PATENT AND TRADEMARK OFFICE
CERTIFICATE OF CORRECTION

PATENT NO. : 7,157,780 B2 Page 1 of 1
APPLICATION NO. : 10/602724
DATED : January 2, 2007
INVENTOR(S) : Yoshinao Harada It is certified that error appears in the above-identified patent and that said Letters Patent is hereby corrected as shown below:

On the title page

Item (56) References Cited, U.S. PATENT DOCUMENTS", add -- US 6,737,716 B1 05/2004 Matsuo et al. --

Signed and Sealed this

Twenty-seventh Day of May, 2008

JON W. DUDAS
*Director of the United States Patent and Trademark Office*

UNITED STATES PATENT AND TRADEMARK OFFICE
CERTIFICATE OF CORRECTION

PATENT NO.        : 7,157,780 B2
APPLICATION NO.   : 10/602724
DATED             : January 2, 2007
INVENTOR(S)       : Yoshinao Harada It is certified that error appears in the above-identified patent and that said Letters Patent is hereby corrected as shown below:

At column 22, claim number 8, line number 67:

$x/(x+y) \leqq 0.10$; should be:

$x/(x+y) \geqq 0.10$.

Signed and Sealed this
Twenty-sixth Day of March, 2013

Teresa Stanek Rea
*Acting Director of the United States Patent and Trademark Office*